United States Patent
Alles

(10) Patent No.: US 9,194,892 B2
(45) Date of Patent: Nov. 24, 2015

(54) MATCHING POSITIVE TRANSITIONS IN A TIME TRACE DISAGGREGATION PROCESS

(75) Inventor: Harold Gene Alles, Lake Oswego, OR (US)

(73) Assignee: VERLITICS LLC, Portland, OR (US)

( * ) Notice: Subject to any disclaimer, the term of this patent is extended or adjusted under 35 U.S.C. 154(b) by 658 days.

(21) Appl. No.: 13/601,071

(22) Filed: Aug. 31, 2012

(65) Prior Publication Data

US 2014/0067292 A1 Mar. 6, 2014

(51) Int. Cl.
| | |
|---|---|
| G01R 19/165 | (2006.01) |
| G01R 21/00 | (2006.01) |
| G01R 19/25 | (2006.01) |
| H02J 13/00 | (2006.01) |
| H02J 3/14 | (2006.01) |
| H02J 3/00 | (2006.01) |

(52) U.S. Cl.
CPC .............. *G01R 19/2513* (2013.01); *H02J 3/00* (2013.01); *H02J 3/14* (2013.01); *H02J 13/0006* (2013.01); *Y04S 20/224* (2013.01)

(58) Field of Classification Search
CPC ........... H02J 3/00; H02J 3/14; H02J 13/0006; Y04S 20/224
USPC ........ 702/60, 61, 64, 65, 66, 67, 189; 706/54; 715/772
See application file for complete search history.

(56) References Cited

U.S. PATENT DOCUMENTS

| | | | |
|---|---|---|---|
| 4,858,141 A | 8/1989 | Hart et al. | |
| 5,216,623 A | 6/1993 | Barrett et al. | |
| 5,483,153 A | 1/1996 | Leeb et al. | |
| 5,572,438 A | 11/1996 | Ehlers et al. | |
| 5,706,191 A | 1/1998 | Bassett et al. | |
| 6,438,472 B1* | 8/2002 | Tano et al. | 701/29.6 |
| 6,470,283 B1 | 10/2002 | Edel | |
| 6,868,293 B1 | 3/2005 | Schurr et al. | |
| 6,906,617 B1 | 6/2005 | Van der Meulen | |
| 6,983,210 B2 | 1/2006 | Matsubayashi et al. | |
| 7,170,052 B2* | 1/2007 | Furutani et al. | 250/287 |
| 7,174,260 B2 | 2/2007 | Tuff et al. | |
| 7,246,014 B2 | 7/2007 | Forth et al. | |
| 7,343,226 B2 | 3/2008 | Ehlers et al. | |
| 7,379,997 B2 | 5/2008 | Ehlers et al. | |
| 7,423,546 B1 | 9/2008 | Aisa | |
| 7,460,930 B1 | 12/2008 | Howell et al. | |
| 8,275,561 B2* | 9/2012 | Alles | 702/61 |
| 8,825,414 B2* | 9/2014 | Garvey et al. | 702/34 |
| 2005/0230615 A1* | 10/2005 | Furutani et al. | 250/287 |
| 2010/0191487 A1* | 7/2010 | Rada et al. | 702/60 |
| 2010/0287485 A1* | 11/2010 | Bertolami et al. | 715/764 |
| 2011/0101956 A1* | 5/2011 | Thorn | 324/76.11 |
| 2014/0019072 A1* | 1/2014 | Alles | 702/60 |
| 2014/0062456 A1* | 3/2014 | Alles | 324/86 |

\* cited by examiner

*Primary Examiner* — Carol S Tsai

(57) ABSTRACT

A method can include detecting a positive transition in a time trace disaggregation process (TTDP), creating a new instance j, capturing a positive transition data block for the instance j, creating a time trace feature description for power, reactive power, and current, and matching the instance j to a device type by performing a quick match based on at least one quick match parameters. Responsive to a positive identification based on the quick match, the instance j may be assigned to the device type.

21 Claims, 21 Drawing Sheets

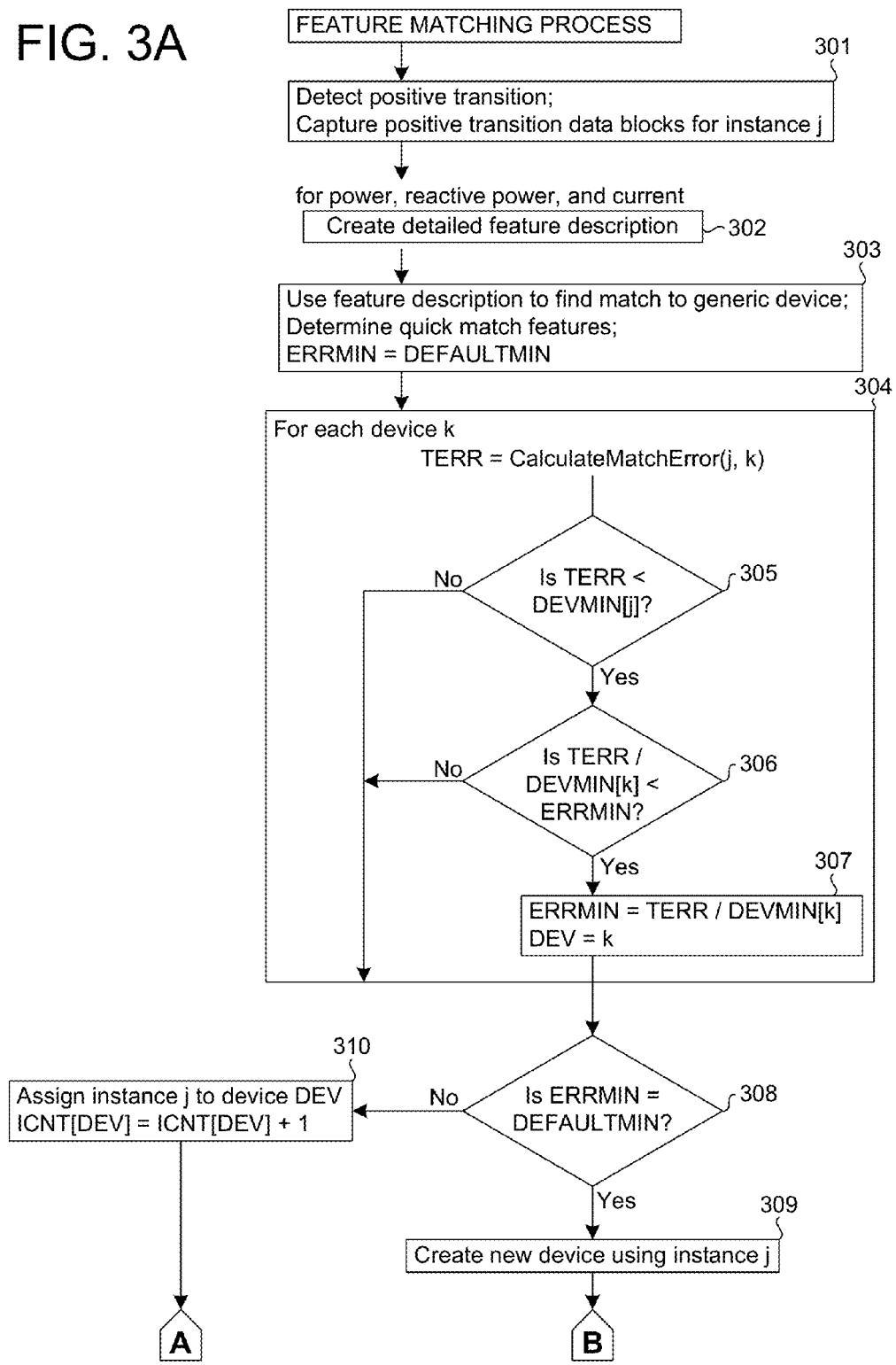

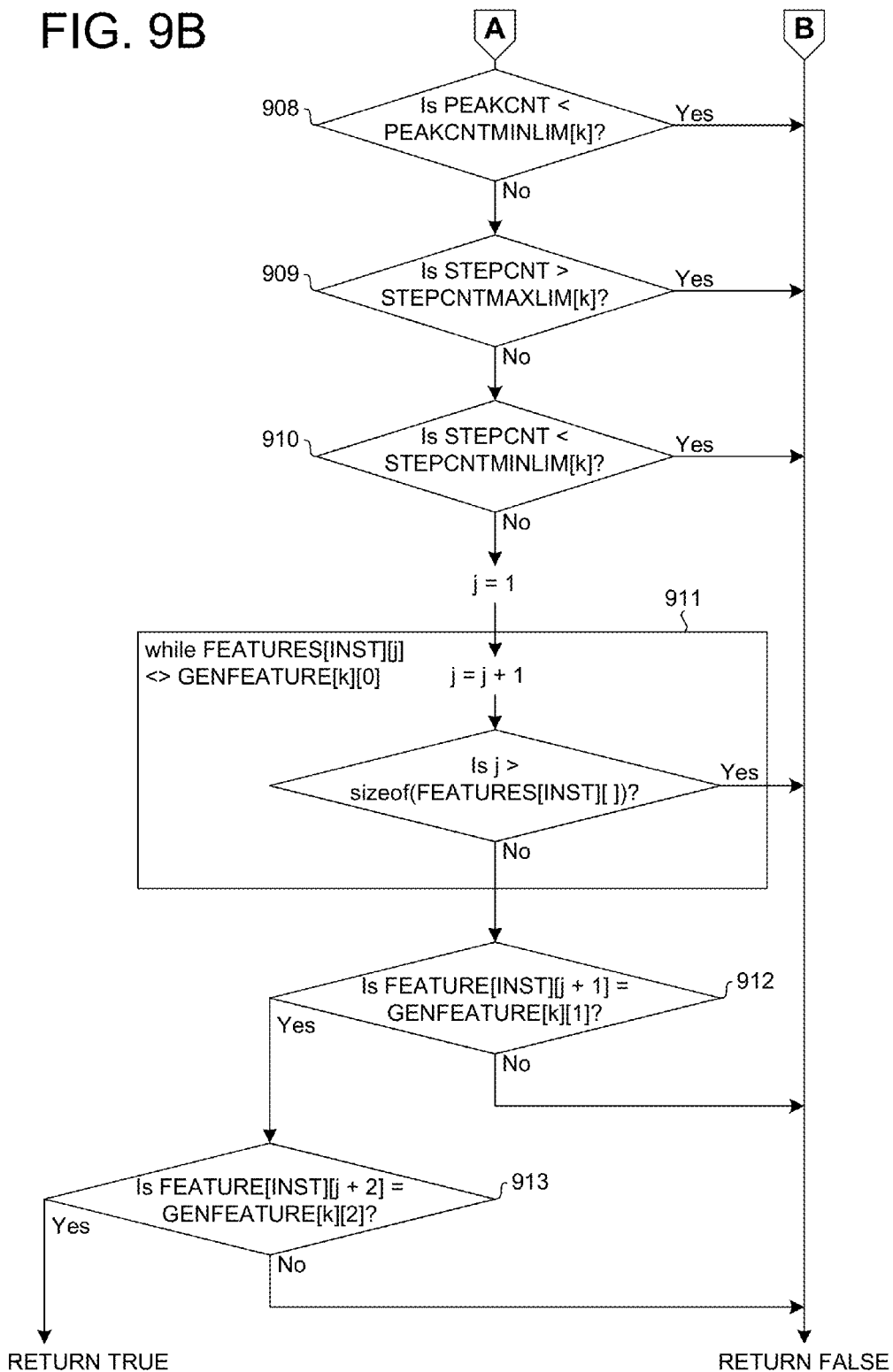

MATCHING POSITIVE TRANSITIONS IN A TIME TRACE DISAGGREGATION PROCESS

TECHNICAL FIELD

This disclosure relates generally to time trace disaggregation processes, and more particularly to processes and operations for matching positive transitions in a time trace disaggregation process (TTDP).

BACKGROUND

Previous processes for identifying multiple individual loads supplied by a common AC power service use measurements of electrical parameters of only the common supply. These parameters are digitally measured for each alternating current (AC) supply cycle, e.g., 60 samples per second in North America. The loads are identified using the time dependent behaviors (referred to herein as time traces) of the first few seconds of the turn-on positive transition of these parameters. Many conventional devices such as incandescent lights and heaters consume essentially constant power after the positive transition until the device is turned off, thus producing a negative transition. Provided none of the transitions occur too close together, the on-off state of multiple devices can be accurately determined, as well as the power, runtime, and energy consumed by each device. This process is referred to herein as a time trace disaggregation process (TTDP).

An important consideration in a TTDP is matching the time trace of a new positive transition with a similar previous time trace associated with a particular device. If no match is found, the new time trace is to be used as a template for a new device.

The process for matching must balance selectivity versus tolerance. If the match is too selective, then multiple devices will be created that represent the same physical device. If the process for matching is too tolerant, however, multiple physical devices will be associated with the same device in the TTDP.

Some devices produce very consistent time traces. For example, incandescent lights and heaters produce very consistent time traces. The time between cycles and the duration of a cycle have essentially no effect on the time trace for these devices.

Some devices are sensitive to operating conditions and produce time traces that vary significantly. For example, multiple slow-start florescent lights controlled by one switch typically produce inconsistent time traces. This is because each light flickers and turns on with a delay that depends on its temperature. The time trace produced by cold lights is usually significantly different from the time trace produced by warm lights. The lights generally take several minutes to fully cool after being turned off. So, if a light is turned on shortly after it was turned off, the time trace will be usually be significantly different.

Some buildings may have different devices that have similar characteristics, such as incandescent lights that use 40 watts, 60 watts, and 75 watts, for example. The matching process should be sufficiently selective to create separate devices for each different light power. However, if there is only a single device that produces a unique and highly variable time trace, then the matching should be very tolerant so that even imperfect time traces may be matched to the device.

Because of these considerations, the matching process must have an adaptable selectivity that can be adjusted based on the device type and the combination of devices served by the common supply. Current technologies provide no such processes.

Considering all of the process required to identify and track a single on-off cycle of a device, the match process requires the largest computing resource. Therefore, the computing resource required to perform an analysis generally depends on the efficiency of the matching process.

SUMMARY

Certain embodiments of the disclosed technology include implementations configured to provide an improved time trace matching process for a time trace disaggregation process (TTDP).

Certain embodiments of the disclosed technology may include implementations configured to provide a matching process having adaptable selectivity.

Certain embodiments of the disclosed technology may include implementations configured to provide a matching process that is computationally efficient.

DETAILED DESCRIPTION

Figure 1A:
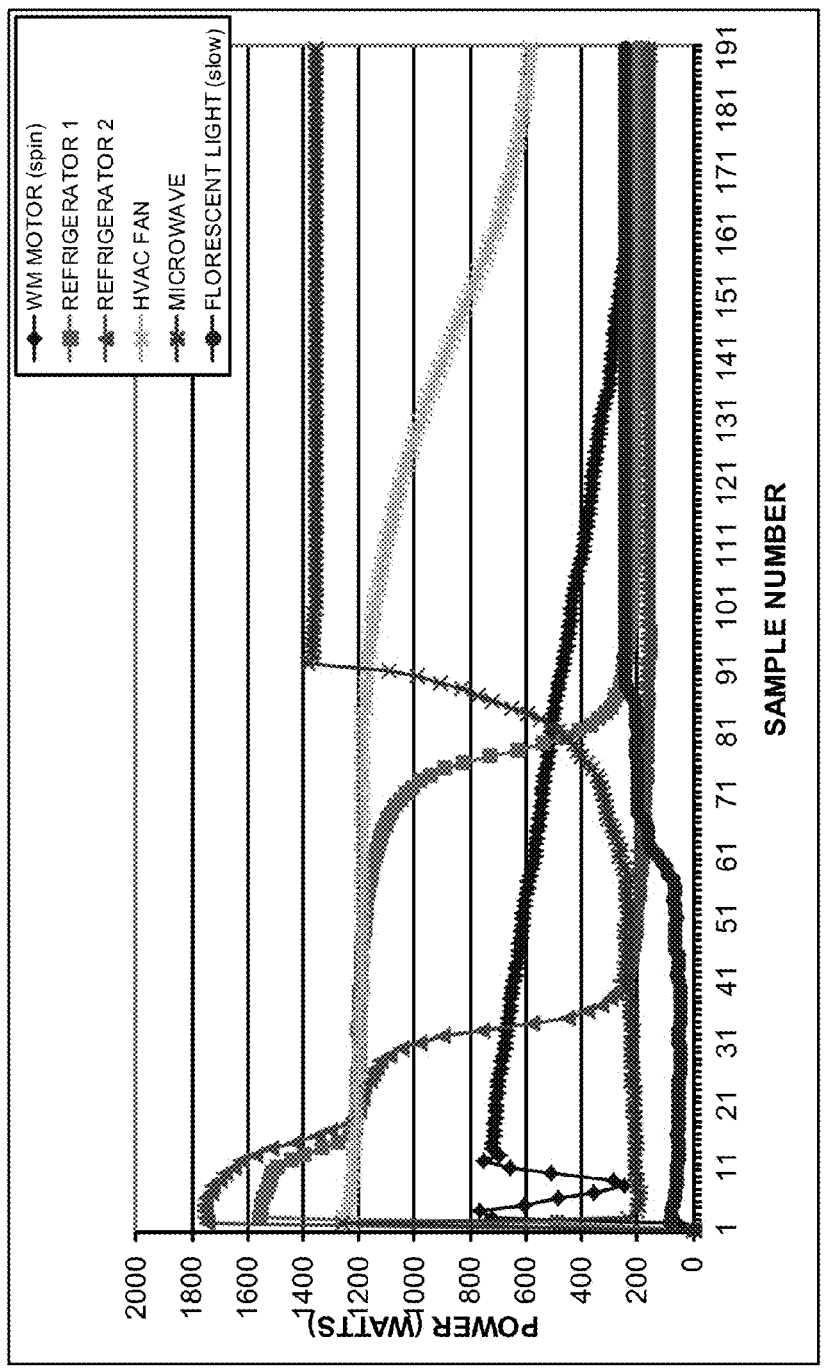
FIG. 1A illustrates typical power positive transition time traces produced by six typical devices.

FIG. 1A illustrates typical power positive transition time traces produced by six typical devices. For these devices, stable power usage generally occurs from one second (e.g., 60 samples) to over three seconds (e.g., 190 samples) after the start of positive transition.

Figure 1B:
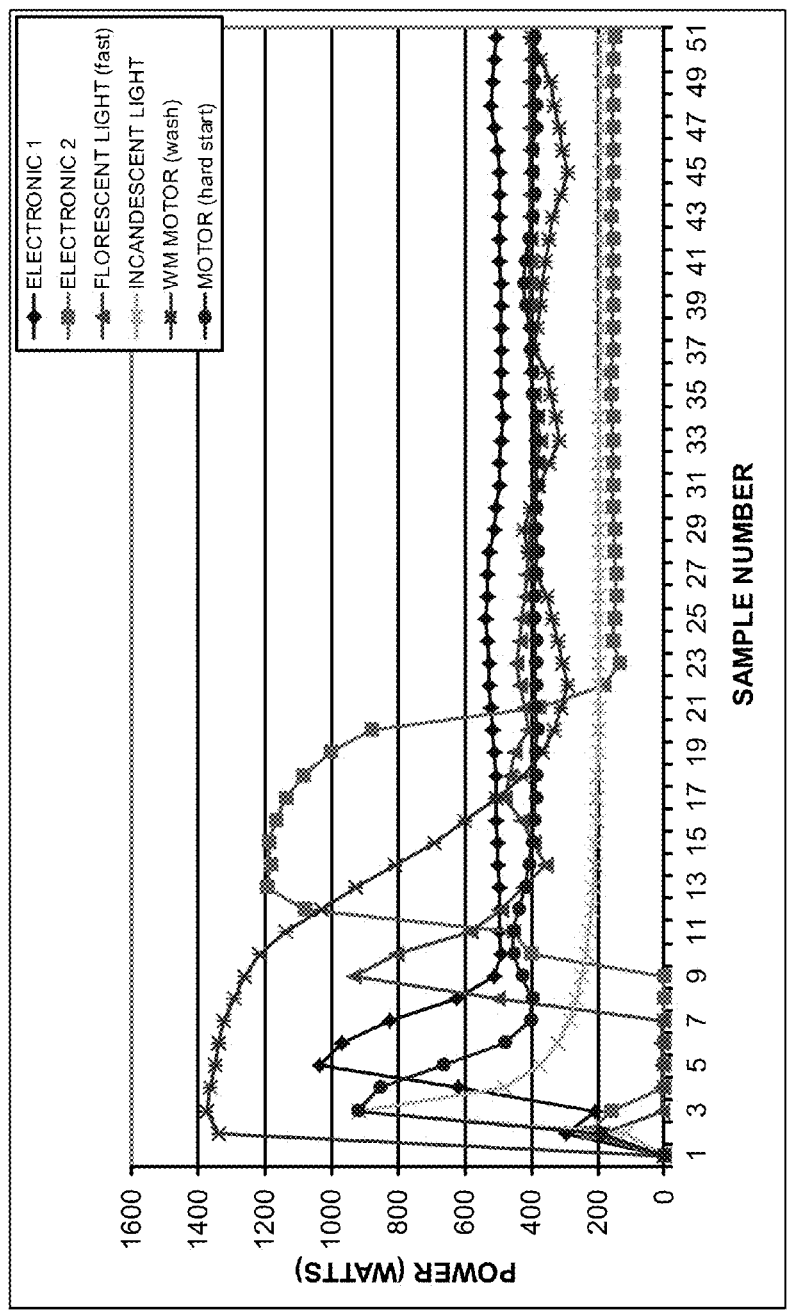
FIG. 1B illustrates typical power positive transition time traces produced by six devices other than the typical devices of FIG. 1A.

FIG. 1B illustrates typical power positive transition time traces produced by six devices other than the typical devices of FIG. 1A. In the example, these devices all have stable power consumption after about 0.5 seconds (e.g., 30 samples).

Devices of the same general category may have significantly different time traces. For example, REFRIGERATOR 1 and REFRIGERATOR 2 in FIG. 1A have similar characteristic features but are clearly produced by different devices. ELECTRONIC 1 and ELECTRONIC 2 in FIG. 1B have less similar features but share sufficient features to be identified in the same broad category of "electronic" type device. Included in this broad category are other devices such as large screen televisions, high power audio amplifiers, and personal computers with CRT monitors, for example.

Figure 2A:
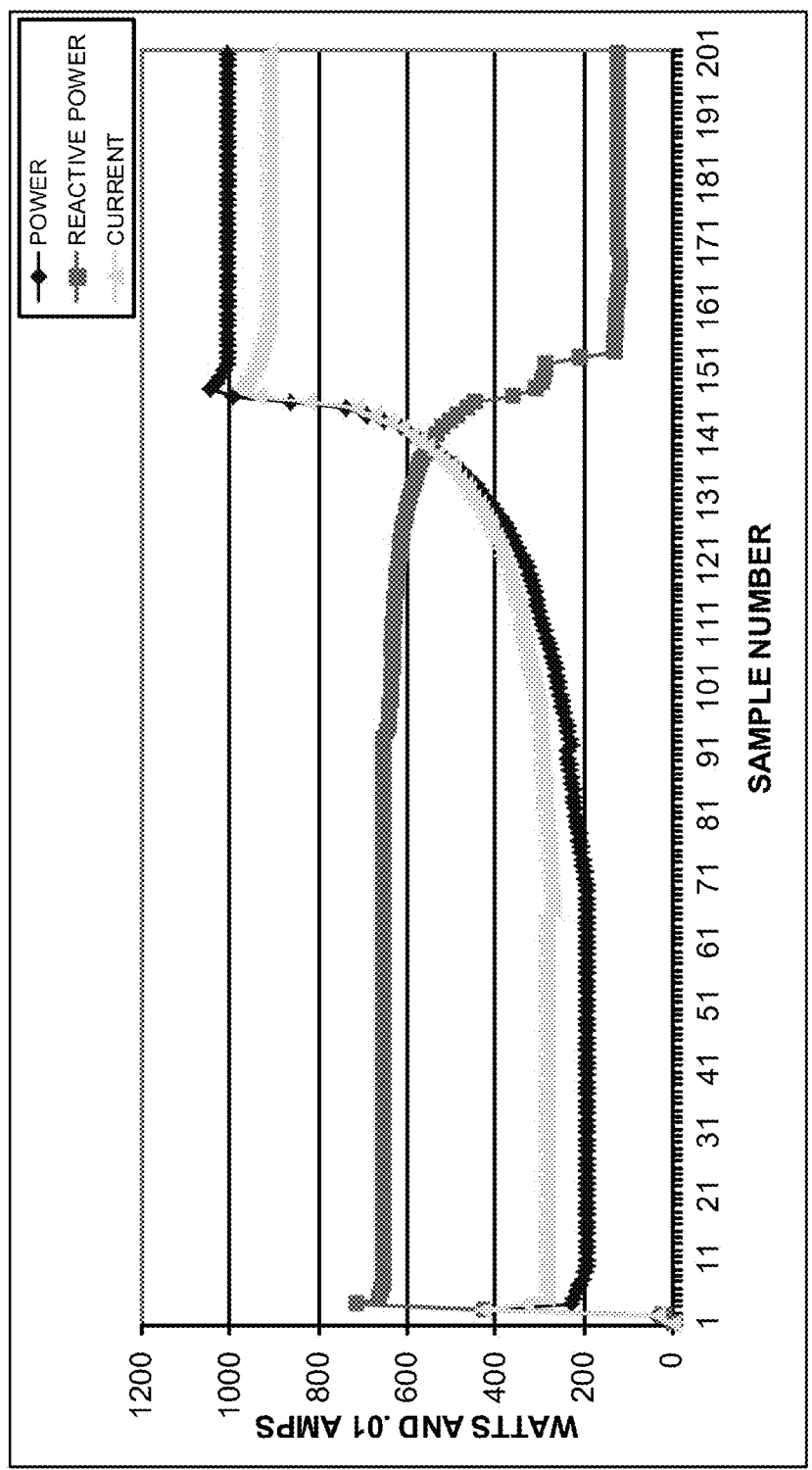
FIG. 2A illustrates positive transition time traces for power, reactive power, and current produced by a microwave oven.

FIG. 2A illustrates the time traces for power, reactive power, and current for a household microwave oven. In the example, each time trace has significant differences from the other. Since these parameters are related, any pair of traces can be used to derive the third. However, the effects of measurement noise and power line noise can be reduced by processing and matching all three time traces as though they were independent variables. Typically, the time traces for power and current and similar. However, the time trace for reactive power can be quite different. For the microwave oven, the behavior of the reactive power is somewhat like a mirror image of the power.

Figure 2B:
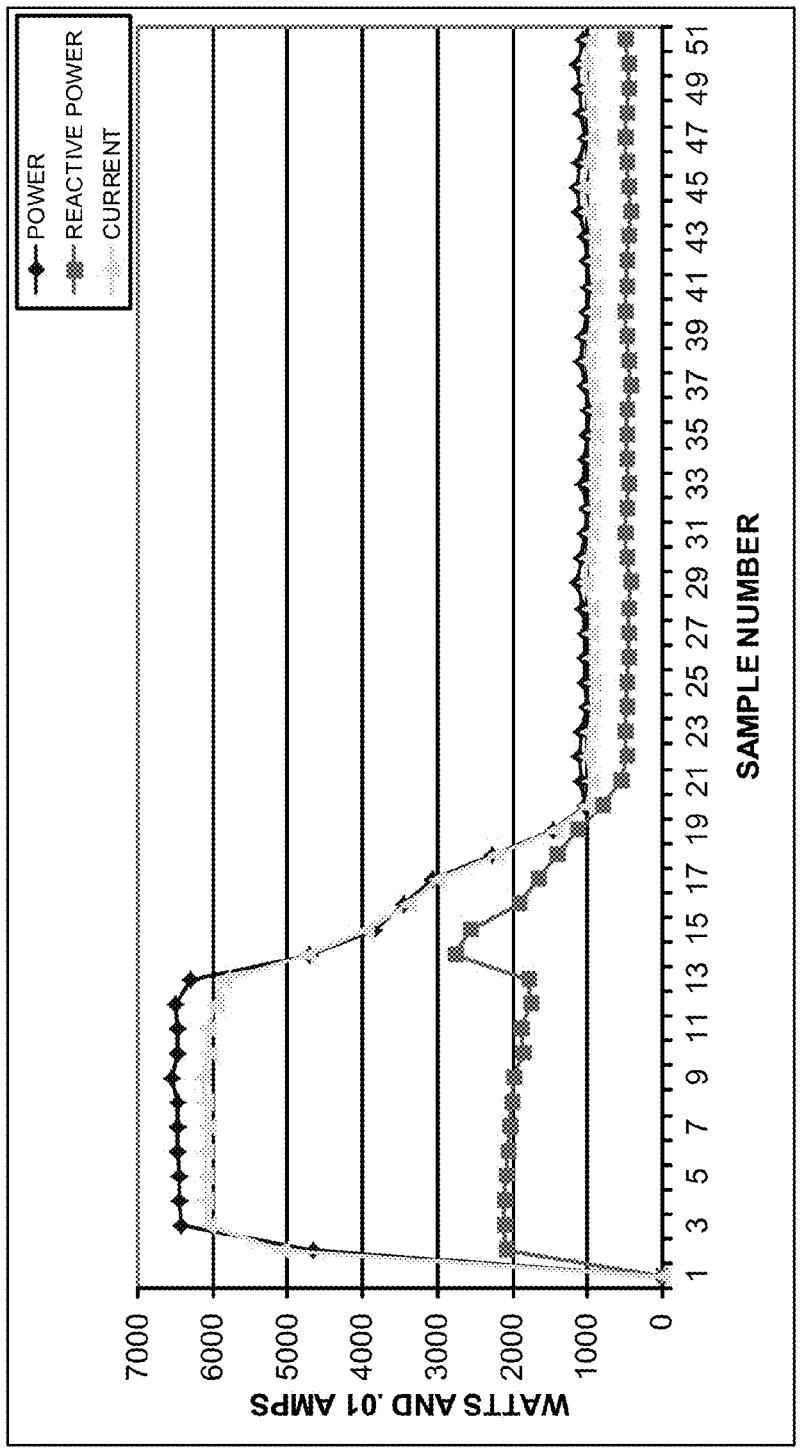
FIG. 2B illustrates positive transition time traces for power, reactive power, and current produced by a capacitor start motor.

FIG. 2B illustrates the time traces for power, reactive power, and current for a one horsepower motor with a start capacitor. Here, a secondary start coil in the motor is connected in series with the start capacitor and the circuit is powered for the first 12 AC cycles. The capacitor-coil combination represents a large reactive power load for these samples. The total power is also much larger during the start. Power is removed from the start circuit at cycle 13, causing a peak in the reactive power from the back EMF of the start coil. The power, reactive power, and current then rapidly decrease as the motor reaches stable operating condition by sample 23, about 0.4 seconds after the start of the transition.

The simplest time traces are generally produced by purely resistive heater elements. The time trace is a step that reaches stable operating conditions within a couple of AC cycles. There is essentially zero reactive power. Lightly loaded induction motors produce a similar power trace, but are also a substantial reactive power load. By considering the time traces of both power and reactive power, the devices can be differentiated even though the power time traces are essentially identical.

Figure 3B:
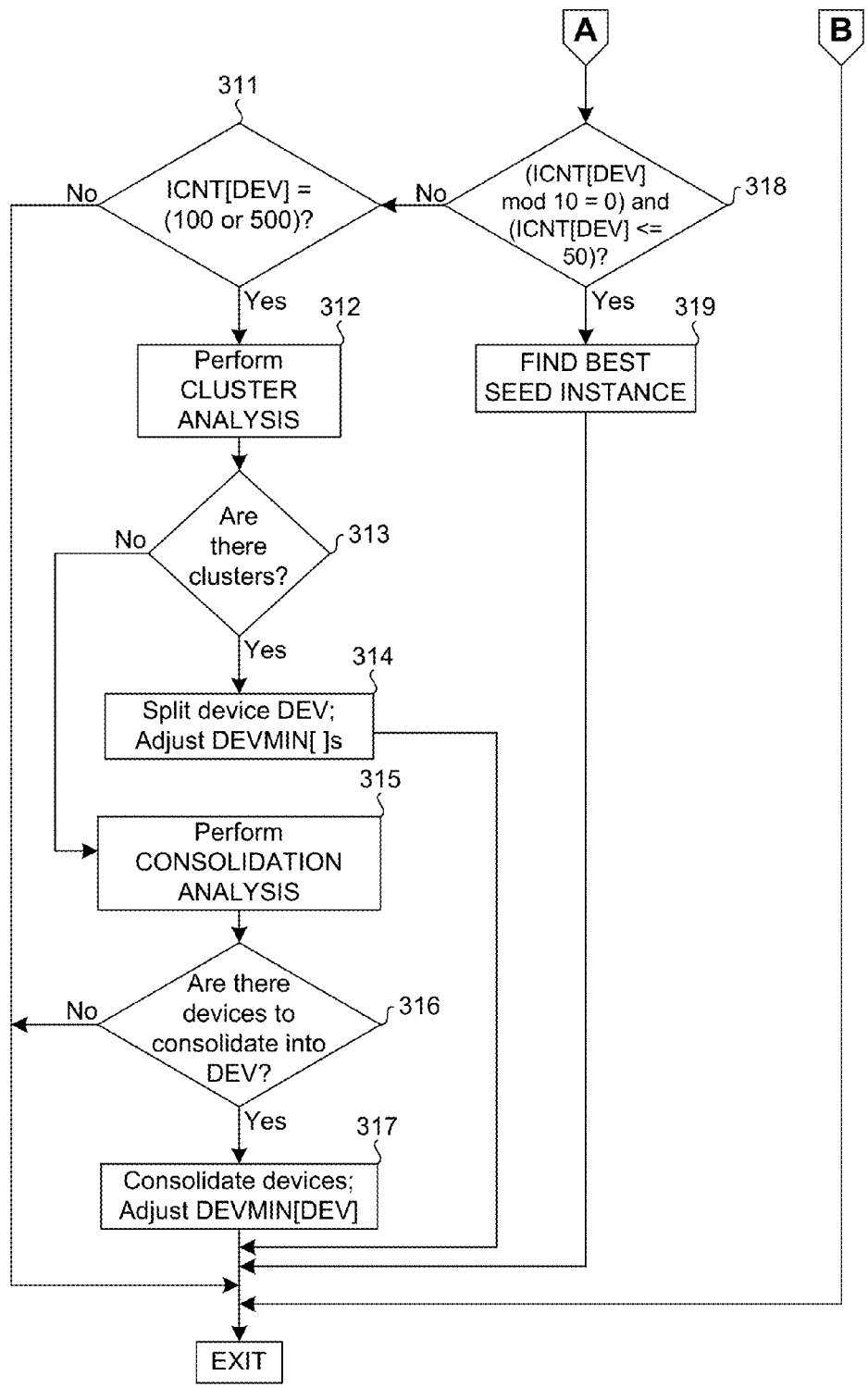
FIG. 3 is a high level flow diagram of a FEATURE MATCHING PROCESS configured to be used in connection with or as part of a time trace disaggregation process (TTDP) in accordance with certain embodiments of the disclosed technology.

FIG. 3 is a high level flow diagram of a FEATURE MATCHING PROCESS configured to be used in connection with or as part of a time trace disaggregation process (TTDP) in accordance with certain embodiments of the disclosed technology. Positive transitions may be detected and processed independently for each service leg (e.g., two legs for residential split single-phase service and three legs for commercial three-phase service).

After a positive transition is detected, a new instance numbered j may be created and its positive transition data block may be captured, as indicated at 301. The transition data block generally contains samples for power, reactive power and current. The average values of power, reactive power, and current may be determined for samples immediately before the positive transition. These average values may be subtracted from each corresponding sample of the transition data block. The value of the first samples of power, reactive power, and current in the transition data block are usually zero. The second sample is typically the first affected by the positive transition.

In the example, the maximum number of samples in the transition data block is 300 (e.g., 5 seconds). There may be fewer samples if all parameter values become stable after at least 60 samples. If another significant positive transition occurs within the data block, the data block may be ended and another started. The process generally attempts to maximize the probability that both transition blocks can be properly identified and tracked.

Figure 7A:
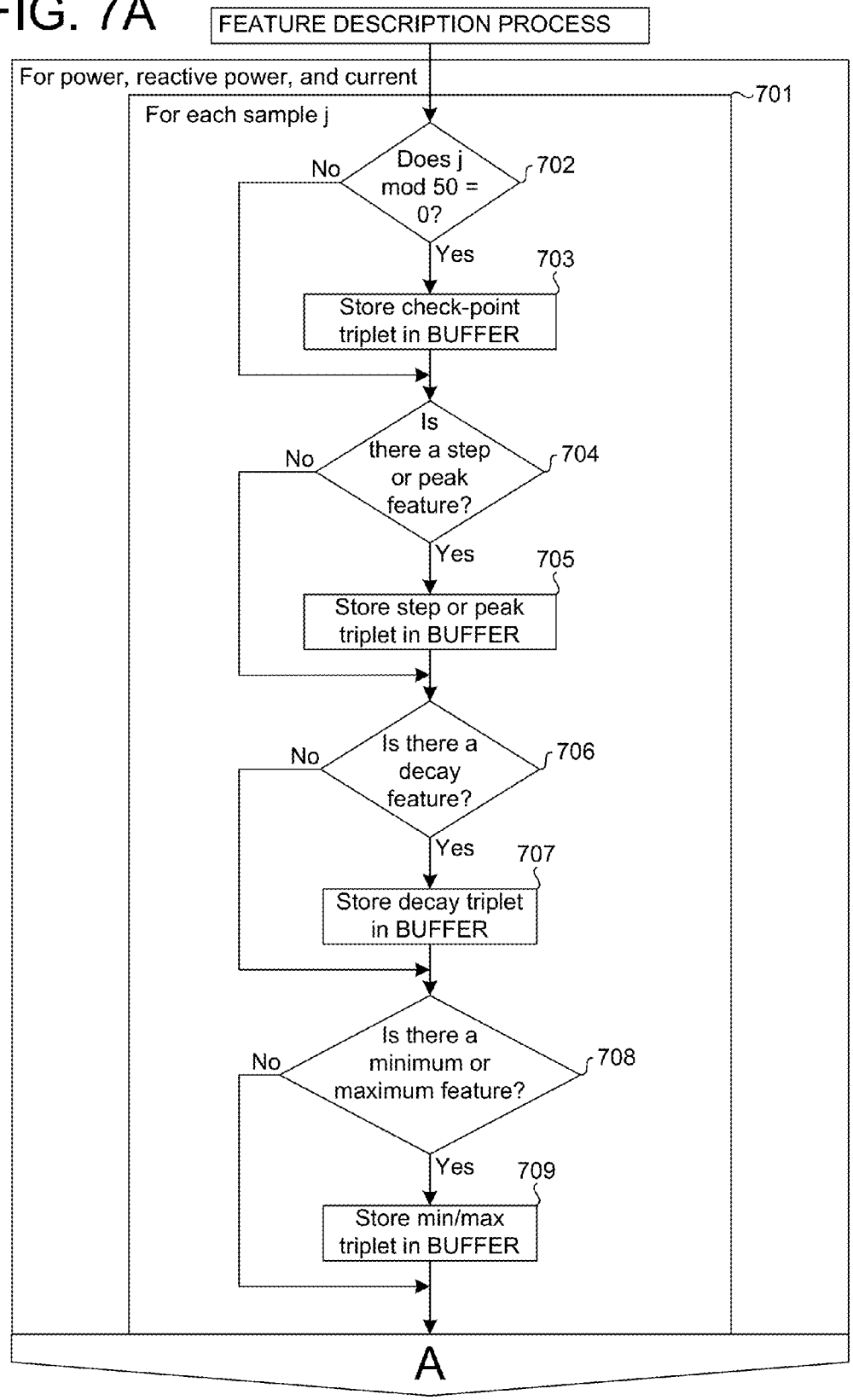
FIG. 7 is a flow diagram of a FEATURE DESCRIPTION PROCESS in accordance with certain embodiments of the disclosed technology.
Figure 7B:
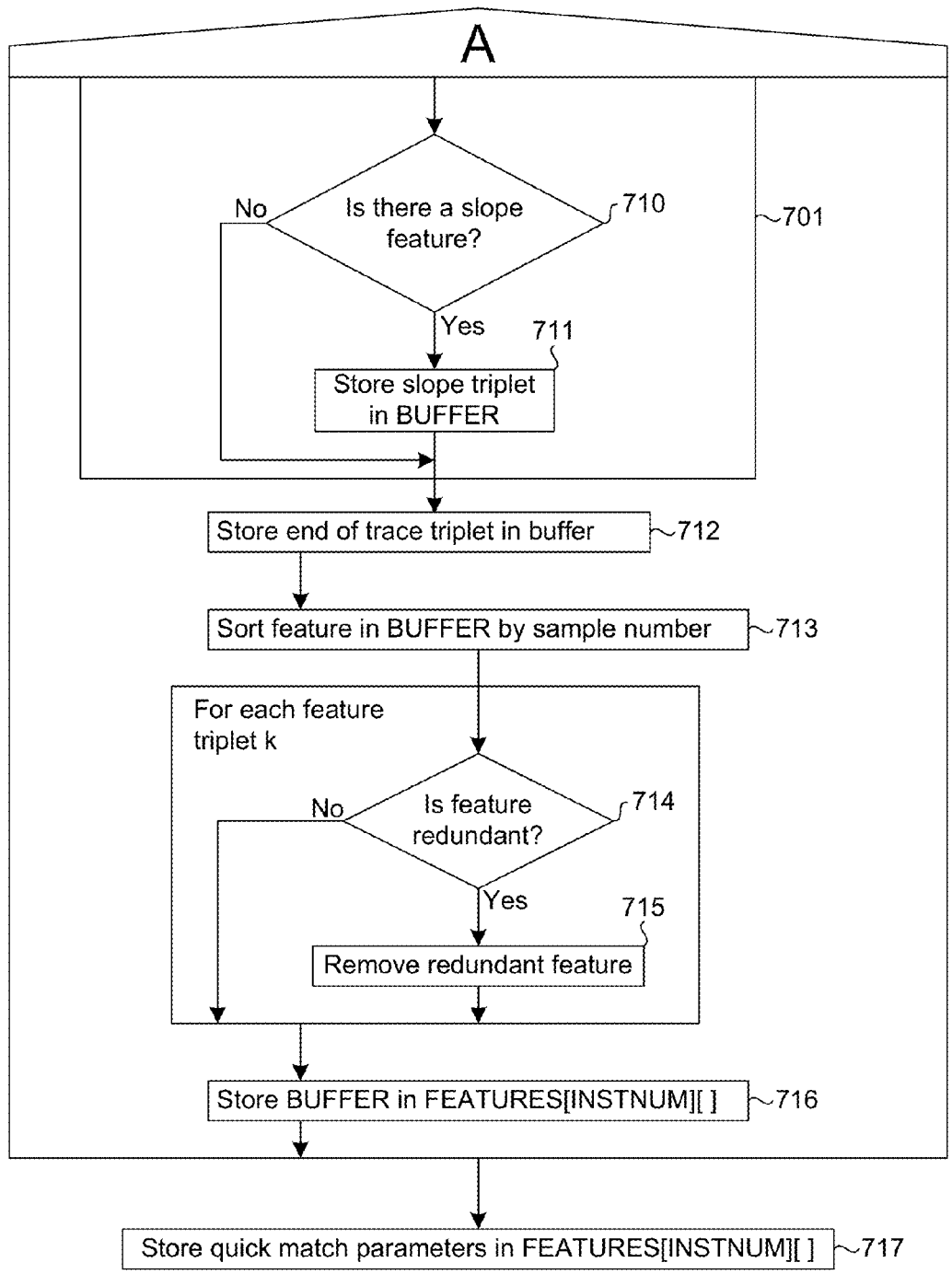

After the transition data block is captured, a detailed feature description of the time trace for power, reactive power, and current may be created, as indicated at 302. Each feature of the time trace may be specified by the following triplet of values:
1. Feature type (e.g., one of the predefined features illustrated by FIGS. 4 and 5, described below)
2. Sample number when the feature occurred
3. Parameter value when the feature occurred The number of features in the description typically depends on the complexity of the time trace. The simplest time trace (e.g., heater) generally requires three features. In certain embodiments, only the first 12 features need be considered when matching time traces. FIG. 7, described below, is a flow diagram of an example of such a FEATURE DESCRIPTION PROCESS.

After the time trace feature descriptions are created, the feature descriptions may be matched to a generic device, as indicated at 303. The features and other general characteristics of the time traces may be considered to find the best match to one of the predefined general categories. Some examples of suitable generic devices are as follows:
1. Heater
2. Induction Motor
3. Hard Start Motor
4. Universal Motor
5. Washing Machine Motor
6. Electric Dryer Motor
7. HVAC Fan Motor
8. Heater+Motor
9. Incandescent Light
10. Fast Start Florescent Light
11. Slow Start Florescent Light
12. Refrigerator
13. Air Conditioner
14. Microwave
15. Large Electronic
16. Small Electronic FIG. 8, described below, is a flow diagram of an example of such a MATCH TO GENERIC DEVICE PROCESS.

The matching process may be composed of a quick match based on six parameters followed by a detailed test based on the time trace features, for example. The quick match parameters may be determined after the feature description and generic assignment are completed. The quick match parameters may include any or all of the following parameters or any suitable variation thereof:
1. Average power during first 50 samples
2. Average reactive power during first 50 samples
3. Average current during first 50 samples
4. Generic device type
5. Service leg
6. Instance code (e.g., one of conventional, periodic, slow, or multi-phase). The general TTDP structures may support several types of instances and devices. The instance code of all instances and devices may be assumed to be conventional or multi-phase.

The six quick match parameters listed above may be associated with each instance and device.

Figure 10A:
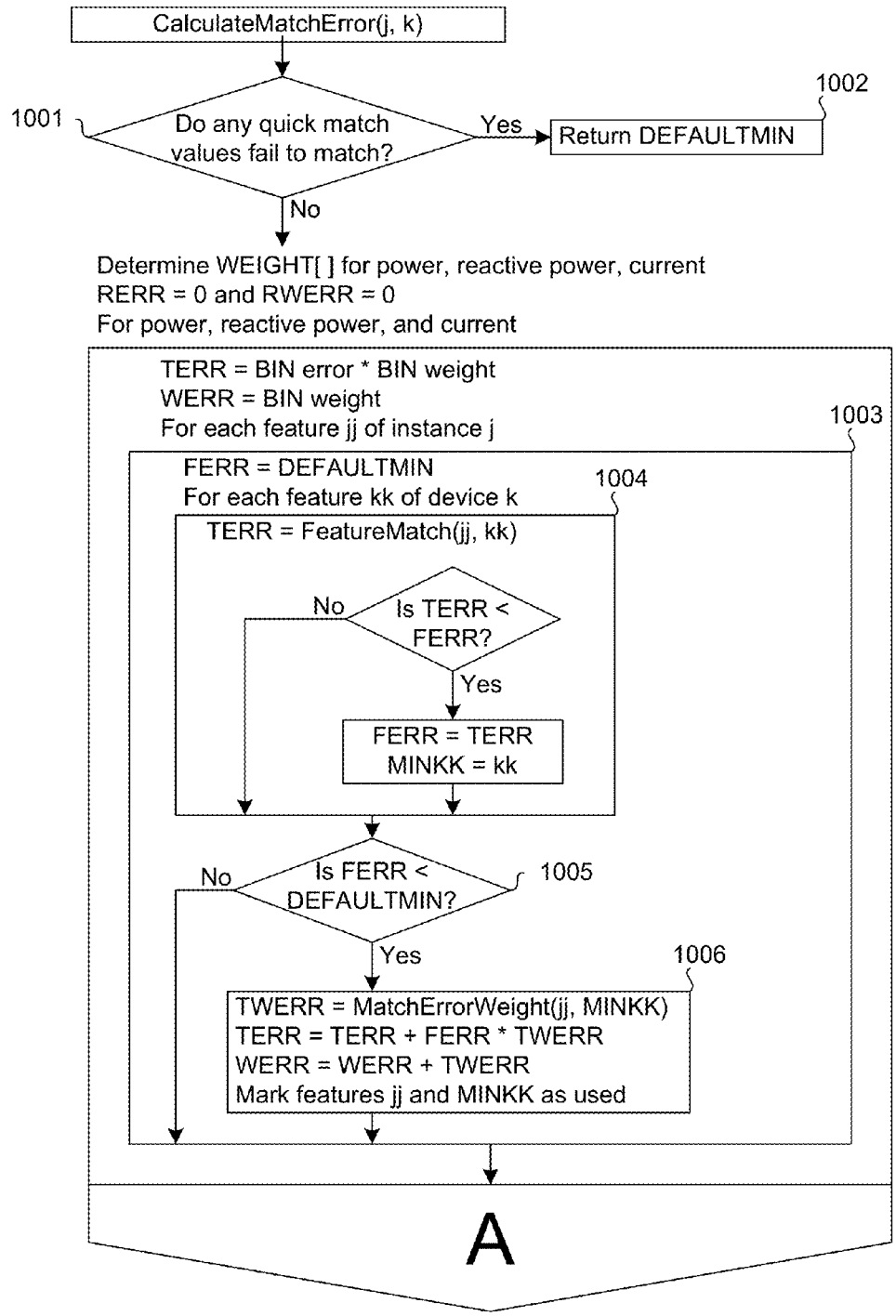
FIG. 10 is a flow diagram of a CalulateMatchError( ) function process to determine the match error value between two feature descriptions of time traces in accordance with certain embodiments of the disclosed technology.
Figure 10B:
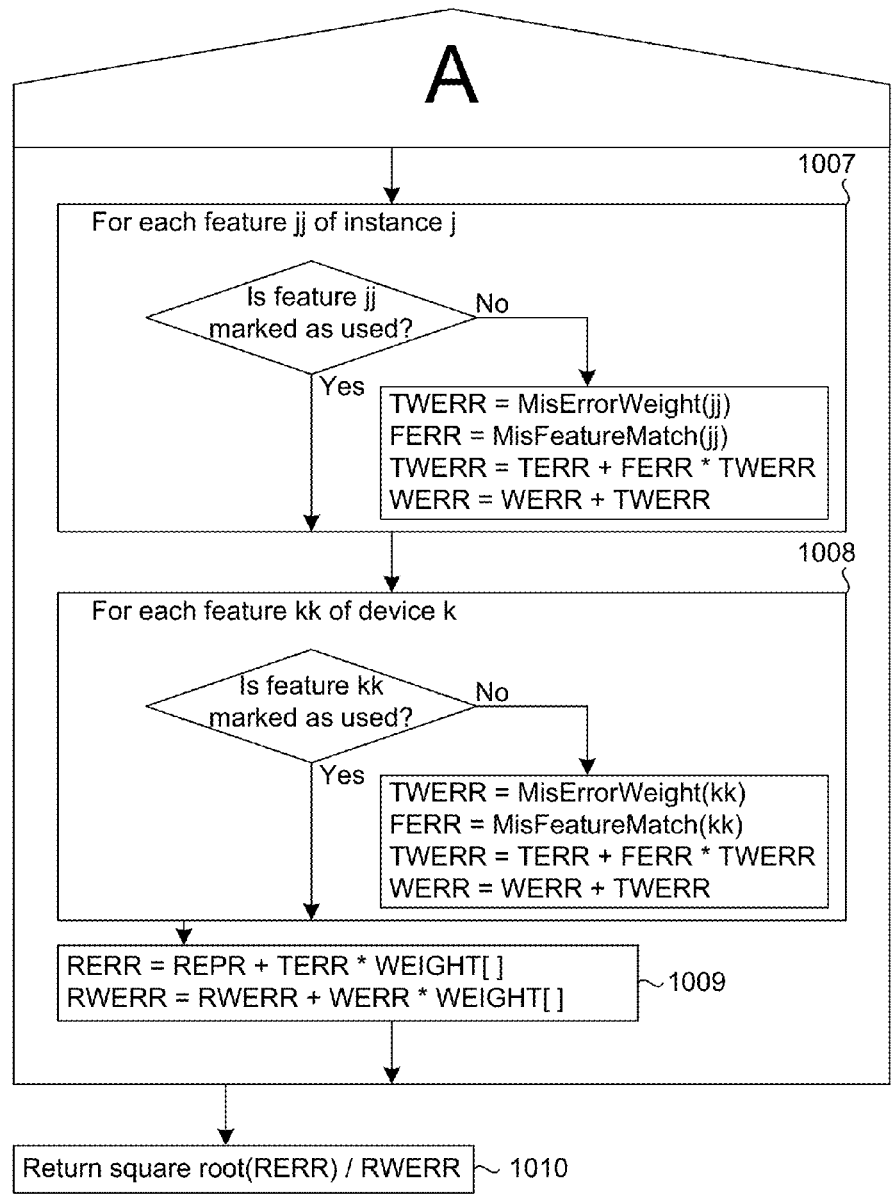

A CalculateMatchError(j, k) function 304 may return an error value that is a measure of similarity between instance j and device k. Devices may be defined by the time trace feature descriptions and quick match parameters of their "seed" instance. Therefore, this routine is essentially comparing the quick match parameters and feature descriptions of two instances. FIG. 10, described below, is a flow diagram of an example of the CalculateMatchError(j, k) function 304.

In the example, the variable ERRMIN may be set to a large value and the instance j may be compared with each existing device. TERR represents the return error from the CalculateMatchError(j, k) function 304. If the value of TERR is less than a threshold match error value DEVNIM[j] for device k as compared at 305, then the device is a potential match.

In the example, DEVMIN[k] was set to a value associated with its generic device when the device k was created. This threshold value generally accounts for the expected variations in the time traces produced by the generic device type. The value of DEVMIN[k] may change after additional data is processed to adapt to the measured behavior of the device.

The best match may be determined by first normalizing TERR by dividing by DEVMIN[k] and then comparing the result to ERRMIN, as indicated at 306. If the normalized match error is less than ERRMIN, then ERRMIN may be set to TERR/DEVMIN[k] and DEV may be set to k, the device number that produced the smaller normalized error, as indicated at 307.

ERRMIN may be compared to DEFAULTMIN, as indicated at 308. If ERRMIN is equal to DEFAULTMIN, then no match was found and the instance j may be used as the seed instance to create a new device, as indicated at 309. The new device may inherit the quick match values and the feature description of the time traces of the instance.

Figure 11:
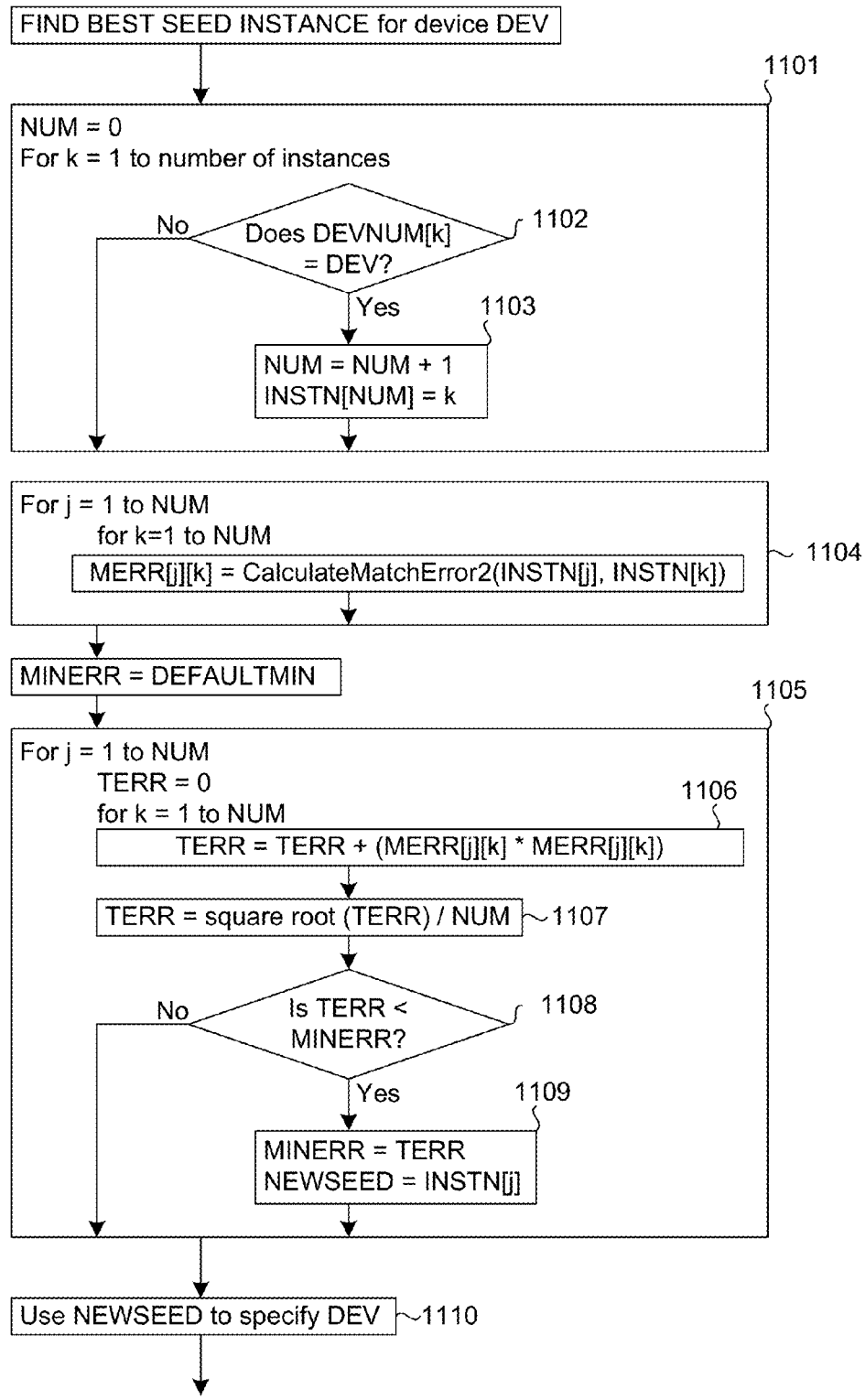
FIG. 11 is a flow diagram of a FIND BEST SEED INSTANCE of DEVICE process in accordance with certain embodiments of the disclosed technology.

If ERRMIN is less than DEFAULTMIN, then the instance may be associated with device DEV, as indicated at 310. In the example, the value of array element ICNT[DEV] is the number of instances matched to device DEV. When ICNT[DEV]=10, 20, 30, 40, or 50, as may be determined at 318, a search may be made for the best seed instance among the instances associated with device DEV, as indicated at 319. Then, the CalculateMatchError(j, k) function may be called for each pair of instances. The match error values between instance j and every other instance may be summed to calculate a total match error for instance j. The instance with the smallest total match error may become the new seed instance. This may ensure that the seed instance behavior is typical and representative of the behavior of the device. FIG. 11, described below, is a flow diagram of an example of such a FIND BEST SEED INSTANCE of DEVICE process.

Figure 12A:
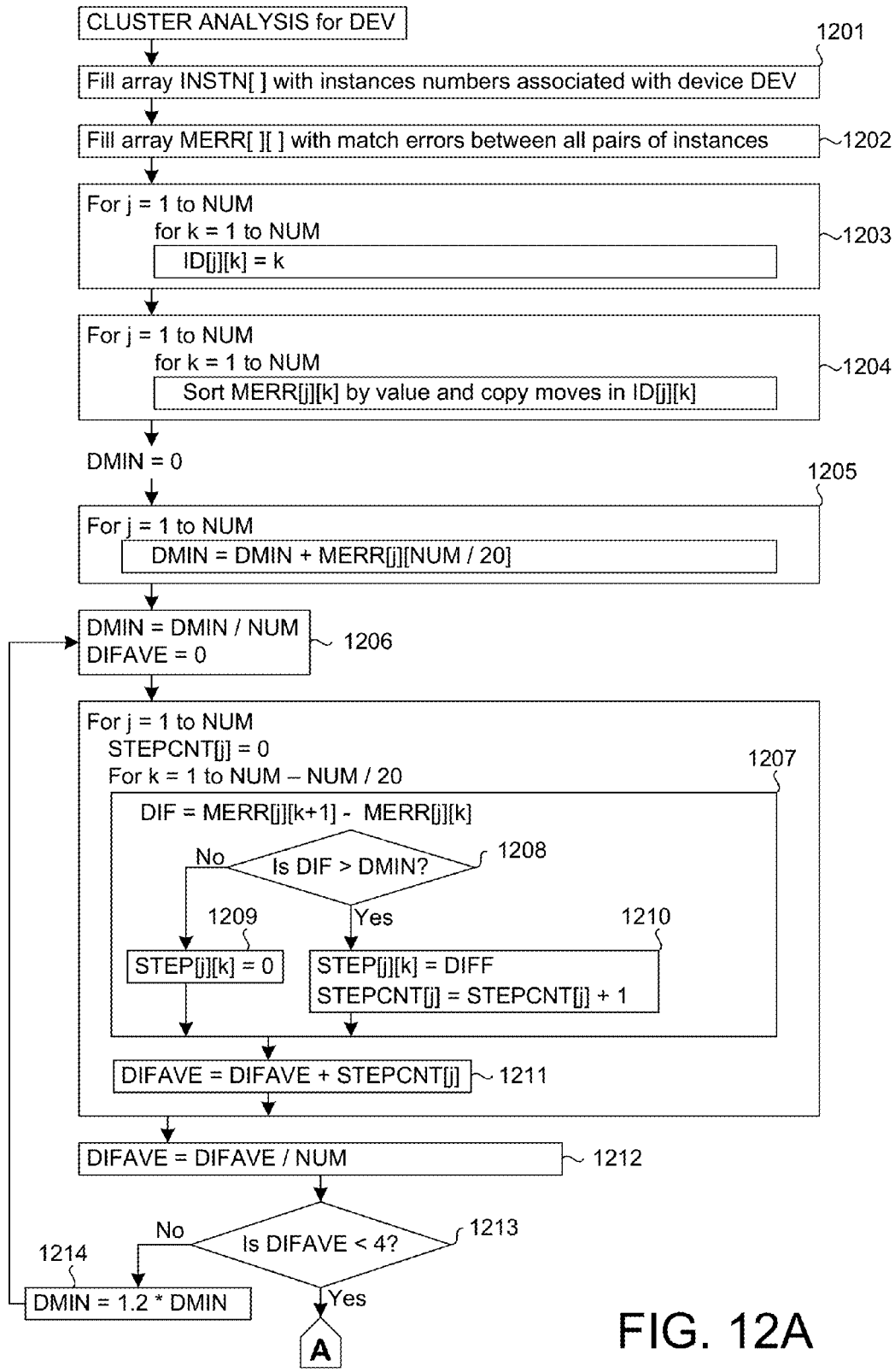
FIG. 12 is a flow diagram of a CLUSTER ANALYSIS for DEVICE process in accordance with certain embodiments of the disclosed technology.
Figure 12B:
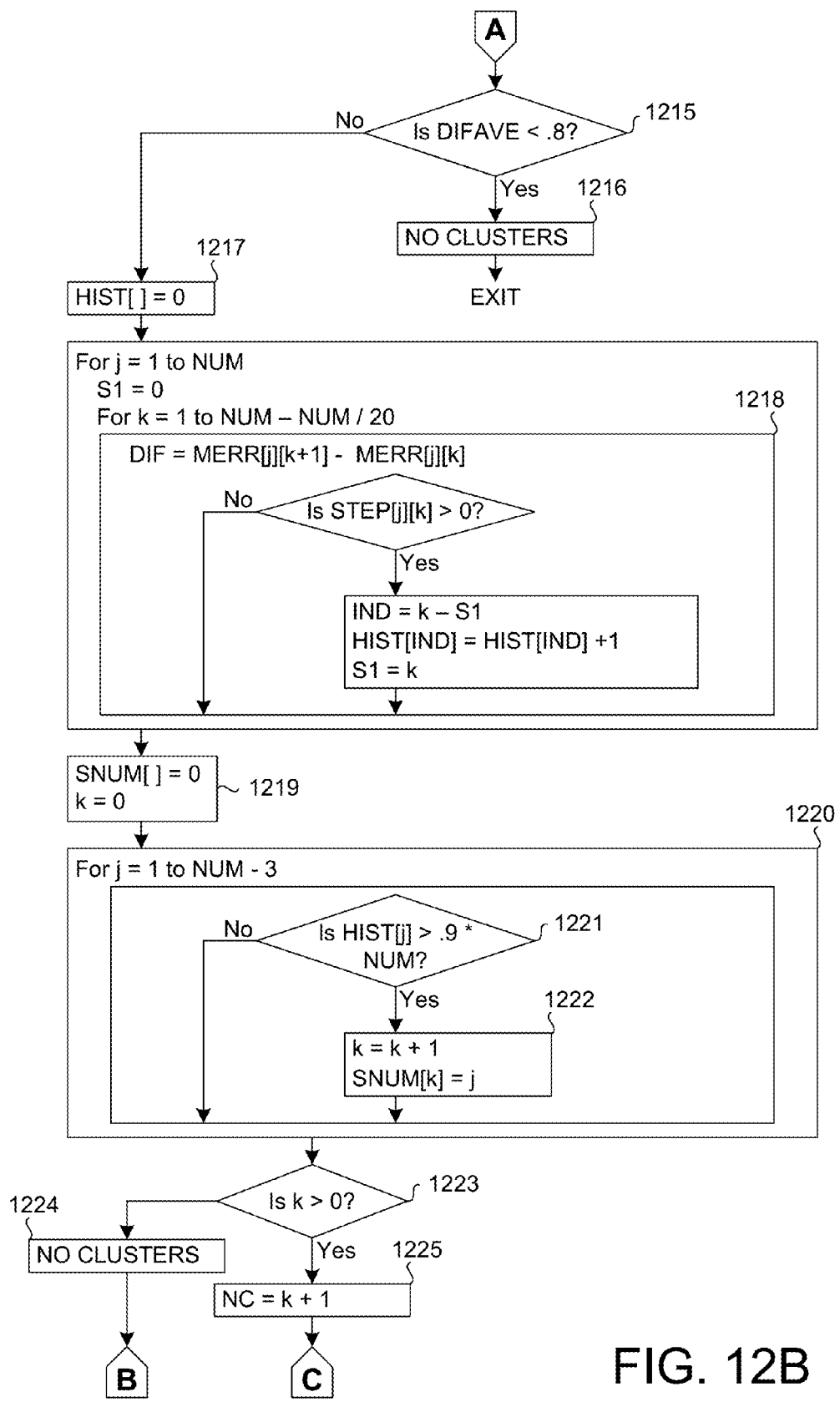
Figure 12C:
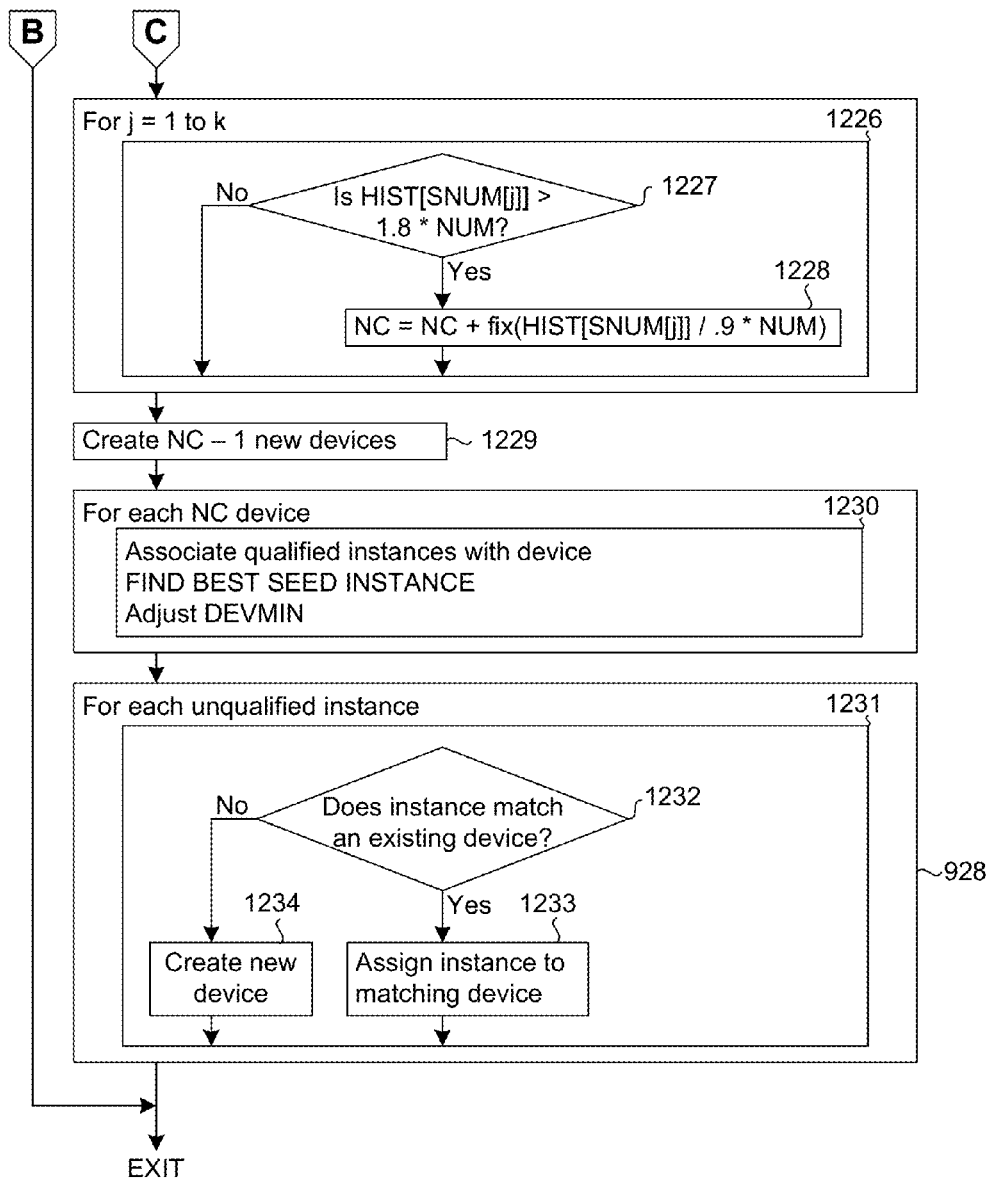

When ICNT[DEV]=100 and 500, as may be determined at 311, a CLUSTER ANALYSIS process, as indicated at 312, may be used to determine whether the match threshold is too large such that two or more different devices may be grouped into a single device. The large number of devices considered may ensure sufficient examples for reliable analysis. FIG. 12, described below, is a flow diagram of an example of a CLUSTER ANALYSIS for DEVICE process as may be performed at 313. If two or more separable clusters are found, new devices may be created so that there is a separate device for each cluster and the value of DEVMIN[ ] for each device may be selected to provide sufficient selectivity so new instances may be properly matched, as indicated at 314.

When ICNT[DEV]=100 and 500, a CONSOLIDATION ANALYSIS process, as indicated at 315, may be used to determine whether there are devices that should be consolidated. The process may be used to determine whether the instances associated with two or more different devices are produced by the same physical device. As noted above, FIG. 12, discussed below, provides an example of such a process.

If there are devices to consolidate, as may be determined at 316, then all of the instances may be associated with one device, a new seed instance may be found, and the match threshold DEVMIN[ ] may be adjusted to ensure that new instances are correctly matched, as indicated at 317.

Any or all of the following 14 features may be used to describe time traces:

1. Check-point—the sample value may be reported every 50 samples, for example, independent of other features.
2. Positive large peak—a rapid large increase in value followed by a rapid large decrease; the peak is usually at least 2.5 times larger than reference values.
3. Negative large peak—a rapid large decrease in value followed by a rapid large increase; the peak is usually at least 2.5 times larger than reference values.
4. Positive small peak—a rapid large increase in value followed by a rapid large decrease; the peak is usually less than 2.5 times larger than reference values.
5. Negative small peak—a rapid large decrease in value followed by a rapid large increase; the peak is usually less than 2.5 times larger than reference values.
6. Positive step—generally, a rapid increase followed by relatively stable samples.
7. Negative step—generally, a rapid decrease followed by relatively stable samples.
8. Maximum value—the maximum value in a local region; hysteresis may be used so that only significant extremes are detected. A minimum value generally must occur before another maximum can occur.
9. Minimum value—the minimum value in a local region; hysteresis may be used so that only significant extremes are detected. A maximum value generally must occur before another minimum can occur.
10. Maximum positive slope—local maximum positive slope determined by linear equation fit using four adjacent samples; hysteresis may be used so that only significant extremes are detected.
11. Minimum slope—local minimum of the absolute slope determined by linear equation fit using four adjacent samples; hysteresis may be used so that only significant extremes are detected.
12. Maximum negative slope—local maximum of negative slope determined by linear equation fit using four adjacent samples, for example; hysteresis may be used so that only significant extremes are detected.
13. Decay—a feature similar to an exponential decay; generally occurs only once in a trace and at least two samples after a positive peak.
14. End of trace—the end of the trace description.

Figure 4:
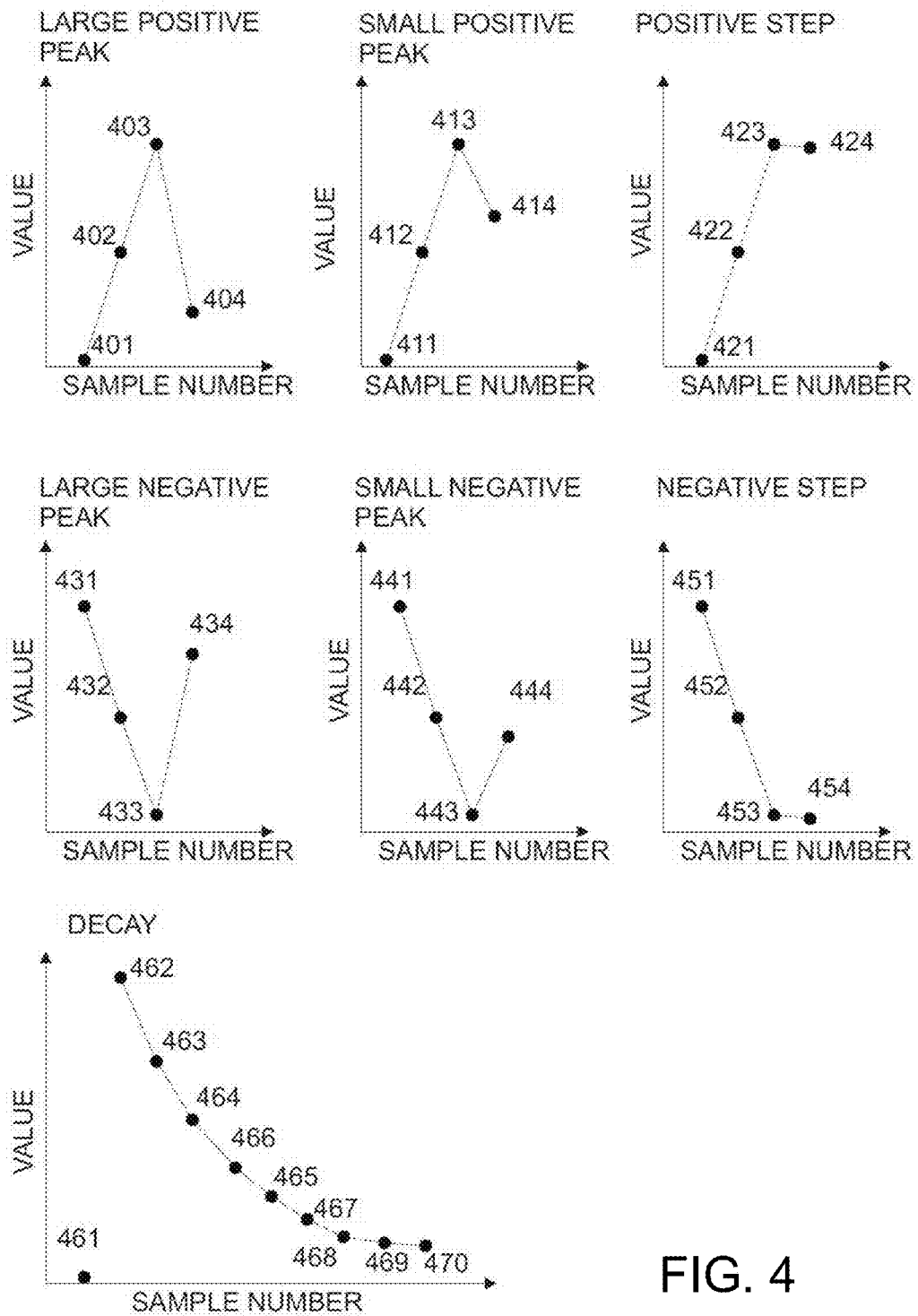
FIG. 4 illustrates examples of PEAK, STEP, and DECAY features used to describe time traces.

FIG. 4 illustrates examples of PEAK, STEP, and DECAY features used to describe time traces. More particularly, FIG. 4 illustrates sequences of four samples that are recognized as large peaks, small peaks, and steps. While peaks and steps are typically determined by the relative values of four sequential samples, additional samples may occasionally be considered.

Samples 401, 402, 403, and 404 are an example of a large positive peak feature. Samples 401, 402, and 403 are rapidly increasing and sample 404 is rapidly decreasing. The magnitude of the difference between 403 and 401 or between 403 and 404 (the larger of the two magnitudes) is more than 2.5 times the magnitude of the difference between sample 401 and 404. There are other relative values that are considered large positive peaks. For example, the first two samples may represent the rapid increase and the last two samples may represent the rapid decrease. The process to detect peaks may consider all permutations of possibilities.

Samples 411, 412, 413, and 414 are an example of a small positive peak feature. Samples 411, 412, and 413 are rapidly increasing and sample 414 is rapidly decreasing. The magnitude of the difference between 413 and 411 or between 413 and 414 (the larger of the two magnitudes) is less than 2.5 times the magnitude of the difference between sample 411 and 414.

Samples 421, 422, 423, and 424 are an example of a positive step feature. Samples 421, 422, and 423 are rapidly increasing and the value of sample 424 is about the same as 423.

Samples 431, 432, 433, and 434 are an example of a large negative peak feature. Samples 431, 432, and 433 are rapidly decreasing and sample 434 is rapidly increasing. Sample 433 is the peak minimum value. The magnitude of the difference between 433 and 431 or between 433 and 434 (the larger of the two magnitudes) is more than 2.5 times the magnitude of the difference between sample 431 and 434.

Samples 441, 442, 443, and 444 are an example of a small negative peak feature. Samples 441, 442, and 443 are rapidly decreasing and sample 444 is rapidly increasing. Sample 443 is the peak minimum value. The magnitude of the difference between 443 and 441 or between 443 and 444 (the larger of the two magnitudes) is less than 2.5 times the magnitude of the difference between sample 441 and 444.

Samples 451, 452, 453, and 454 are an example of a negative step feature. Samples 451, 452, and 453 are rapidly decreasing and the value of sample 454 is about the same as 453.

There are some permutations of values that are ambiguous but may be determined by examining the next sequential sample. When there is a potential peak or step, a flag may be set that affects the evaluation of the next set of for samples that includes one new sample.

Samples 462 through 470 represent an approximate exponential decay from a large value 462. The decay feature generally can occur only once in a transition and must usually follow a positive peak or step feature. The detection process may require that sample values continuously decrease until approximately stable (e.g., samples 469 and 470 in the example). The stable value must generally be less than 0.5 times the peak value, i.e., 462. The feature is generally reported to occur when the sample value becomes less than the average of the peak value and the stable value. In the example, sample 466 represents the decay feature and provides the value and time for the feature triplet.

Figure 5:
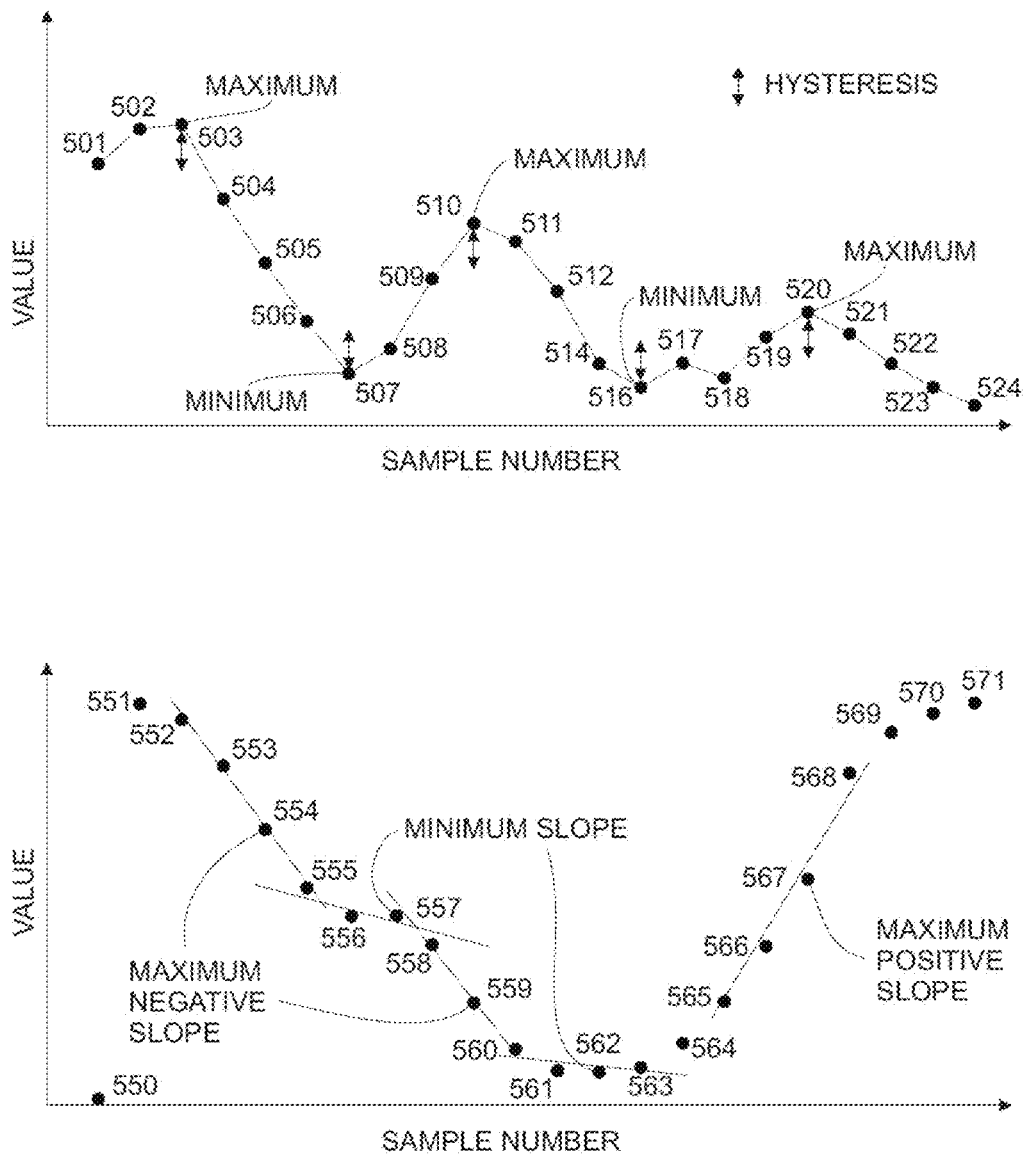
FIG. 5 illustrates examples of MINIMUM, MAXIMUM, and SLOPE features used to describe time traces.

FIG. 5 illustrates examples of MINIMUM, MAXIMUM, and SLOPE features used to describe time traces. Samples 501 through 524 represent a time trace with minimum and maximum features. HYSTERESIS, as represented by a double ended arrow in the figure, may be used to prevent identifying small changes as minimum or maximum features. HYSTERESIS is typically set to 10% of the average parameter value during the first 50 samples.

Sample 503 represents a maximum feature. It is recognized when the difference between sample 503 and a latter sample is less than HYSTERESIS. Here, this occurs with sample 504. Sample 507 represents a minimum feature and is not recognized as a feature until sample 509 since the difference between sample 508 and 507 is less than HYSTERESIS. Samples 510 and 520 represent maximum features. Sample 516 represents a minimum feature. It is not recognized as a feature until sample 519 when the difference becomes greater than HYSTERESIS. Sample 518 does not represent a minimum feature.

Samples 550 through 571 represent a time trace with slope features. In the example, the slope feature process fits four consecutive samples to a linear equation using the least mean squares error process. There is a slope associated with each sample. As samples are processed, the slope is checked for the maximum negative value, minimum absolute value, and maximum positive value. Hysteresis may be used to prevent identifying small changes as slope features.

The slope of the equation fit to samples 552 through 555 represents a maximum (i.e., largest absolute value) negative slope. Here, a maximum negative slope feature is associated with sample 554. The slope then decreases for each successive sample group of four. The slope is a minimum for samples 555 through 558. The slope then becomes more negative. The maximum negative slope occurs for samples 557 through 560. Sample 559 represents a maximum negative slope feature. The slope then becomes less negative, until it goes from negative to positive. The smallest absolute slope occurs for samples 560 through 563. Sample 562 represents a minimum slope feature. The slope increases to maximum for samples 565 through 568. Sample 567 represents a maximum positive slope feature.

Figure 6:
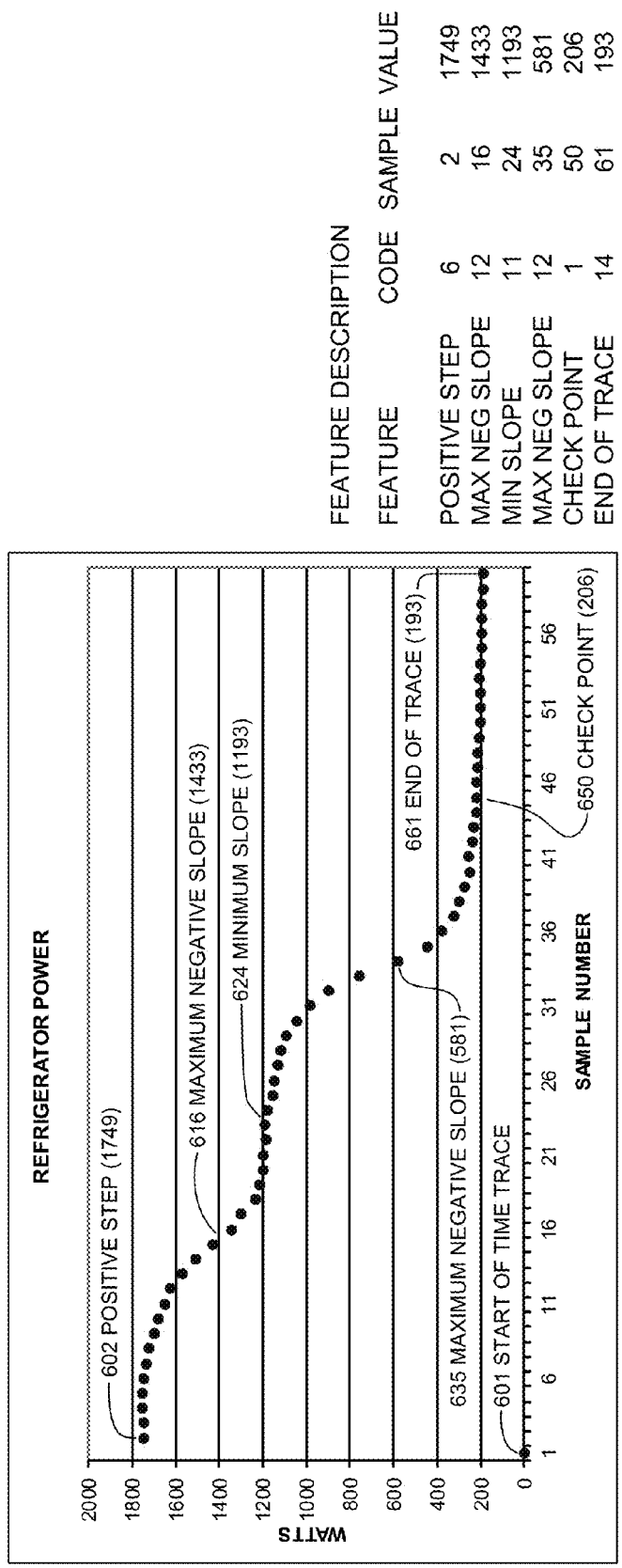
FIG. 6 illustrates the power time trace of a typical refrigerator and its feature description.

FIG. 6 is an example of a power time trace for a typical refrigerator and the features that describe the time trace. Samples 601 through 661 represent the value of the power during the positive transition. The first feature is a positive step associated with sample 602 (the second sample of the time trace). The value of sample 602 is 1749 Watts. A maximum negative slope is associated with sample 616 (the 16$^{th}$ samples) with a value of 1433. These features are followed by a minimum slope (624), a second maximum negative slope (635), a check point (650), and the last feature is an end of trace (661).

In the example, the feature description is composed of the following six triplets:

| Feature | Code | Sample | Value |
| --- | --- | --- | --- |
| Positive Step | 6 | 2 | 1749 |
| Maximum negative slope | 12 | 16 | 1433 |
| Minimum Slope | 11 | 24 | 1193 |
| Maximum negative slope | 12 | 35 | 581 |
| Check point | 1 | 50 | 206 |
| End of trace | 14 | 61 | 193 |

FIG. 7 is a flow diagram of a FEATURE DESCRIPTION PROCESS that may be used to determine the feature description. The power, reactive power, and current parameters may be processed separately. In the example, there are five separate and independent processes that are used detect features:
 1. Check-point process 702-703
 2. Peak and step detection process 704-705
 3. Decay detection process 706-707
 4. Minimum and maximum detection process 708-709
 5. Slope detection process 710-711

Sub-process 701 may be used to sequentially process each of the time trace samples j. Each feature detection process may consider the appropriate number of samples and generate a triplet that specifies the detected feature. The feature triplets may be stored sequentially in BUFFER when the feature values are completely determined, e.g., as indicated at 703, 705, 707, 709, and 711.

The check-point process may report the parameter value for the sample numbers 50, 100, 150, 200, 250, and 300.

The peak and step detection process generally requires at least four consecutive samples. A step or peak feature usually cannot be detected until j=4. Therefore, the triplet for a peak or step feature that occurs at sample 2 is generally not stored in BUFFER until at least sample 4. The other three feature detection processes typically cannot identify the feature until many samples after the sample number that represents the feature. Therefore the triplets stored in BUFFER typically occur not in the order of their sample number.

After process 701 completes, an end of trace triplet may be stored in BUFFER, as indicated at 712. The feature triplets in BUFFER may be subsequently sorted in order of sample number, as indicated at 713.

The same set of samples may be recognized by multiple feature detection process. For example, the minimum and maximum features may also be reported as minimum slope features. As another example, a positive peak feature is also a maximum feature. The feature types are typically assigned a priority from strongest to weakest. The priority from strongest to weakest is generally as follows:
1. Large peak
2. Small peak
3. Step
4. Decay
5. Minimum or maximum
6. Slope When there are redundant features, as may be determined at 714, the weaker features may be removed, as indicated at 715. Check-point and end of trace features are typically not included when testing for redundancy. They are usually never removed nor cause another feature to be removed.

In the example, the remaining sequence of feature triplets may be stored in a two-dimensional array FEATURES[ ][ ], as indicated at 716. The primary index to FEATURES[ ][ ] is generally the instance number INSTNUM. The secondary index typically accesses elements to store the feature description for power, reactive power and current.

The available quick match parameters described above may be stored in FEATURES[ ][ ], as indicated at 717.

Figure 8:
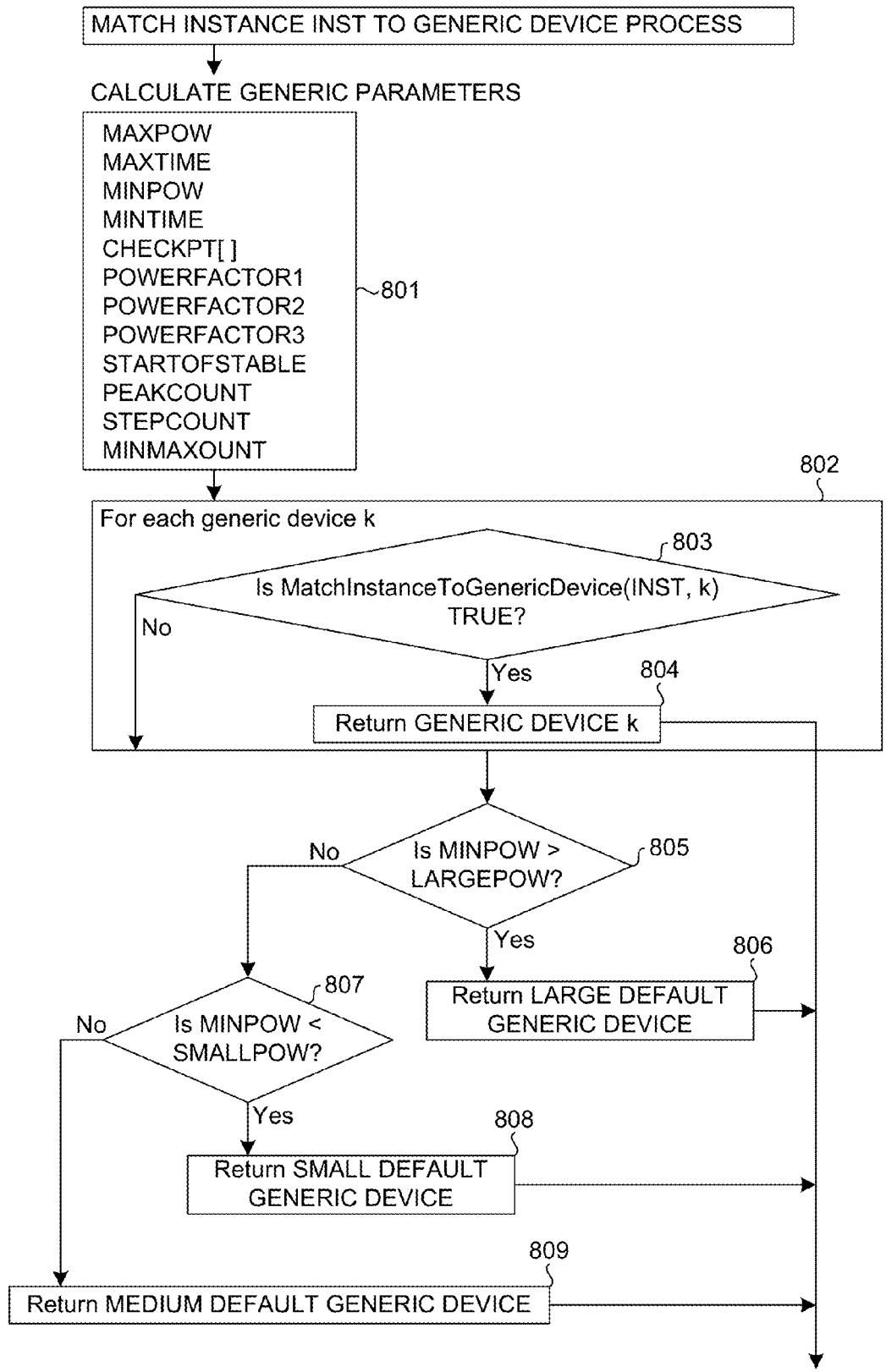
FIG. 8 is a flow diagram of a MATCH TO GENERIC DEVICE PROCESS in accordance with certain embodiments of the disclosed technology.

FIG. 8 is a flow diagram of a MATCH INSTANCE TO GENERIC DEVICE PROCESS that may be used to determine the generic device type using the feature description stored in FEATURES[INST][ ], for example. The first process step generally involves calculating the values of a set of generic parameters, as indicated at 801. In the example, these parameters include:
1. MAXPOW—the maximum power value among the features in the power feature description.
2. MAXTIME—the sample number of the maximum power feature.
3. MINPOW—the minimum power value among the features in the power feature description.
4. MINTIME—the sample number of the minimum power feature.
5. CHECKPT[ ]—an array containing the power check point values. The value at index zero is the value of the end of trace feature.
6. POWERFACTOR1—The power factor calculated using the power and reactive power check point values for sample 50, for example.
7. POWERFACTOR2—The power factor calculated using the power and reactive power check point values for sample 100, for example. POWERFACTOR2=POWERFACTOR1 if the time trace ends before sample 100, for example.
8. POWERFACTOR3—The power factor calculated using the average of the power and reactive power check point values for samples 150, 200, 250, and 300, for example. Only valid check-point values are typically averaged. POWERFACTOR3=POWERFACTOR2 if the time trace ends before sample 150, for example.
9. STARTOFSTABLE—the number of samples after start when the power samples reach relatively stable values.
10. PEAKCOUNT—the number of peak type features in the power trace feature description.
11. STEPCOUNT—the number of step type features in the power trace feature description.
12. MINMAXCOUNT—the number of minimum and maximum features in the power trace feature description.

Features that occur within the first five samples of the start of the time trace are typically not considered when determining MINPOWER. This may prevent spurious start-up spikes from affecting the value.

The term POWERFACTOR as used herein generally refers to the ratio of reactive power to (real) power. Therefore, a purely resistive load has POWERFACTOR=0. The values of POWERFACTOR may be positive or negative and have an absolute value greater than 1.

A TTDP may be adapted for use with three-phase supplies. A multi-phase device may be connected to the supply legs such that no current flows through neutral. For a three-phase supply, the voltage of each leg is generally 120 degrees out of phase relative to the other two legs. For a pure resistive load, the current in each leg is generally 60 degrees out of phase relative to the voltage of the leg. This typically causes a large apparent reactive power for a resistive device. For residential split single-phase supply, the voltages of the two legs are generally 180 degrees out of phase, so the current in each leg is in phase to the voltage of the leg. The calculations of the POWERFACTOR parameters may be adapted to produce identical power factors for the same device, independent of the supply type.

Each specific generic device definition generally includes a set of predetermined constants and function that returns a true value if the data in FEATURES[ ][ ] satisfy the requirements of the specific generic device. Each specific device function can typically access the set of generic parameters at 801.

Sub-process 802 sequentially calls each specific generic device k the function MatchInstanceToGenericDevice(INST, k). If the return value is TRUE, as may be determined at 803, then the code for the specific generic device may be returned by the MATCH INSTANCE TO GENERIC DEVICE PROCESS, as indicated at 804.

If the data in FEATURES[INST][ ] does not match any specific generic device, then one of three default generic devices may be returned, depending on the value of MINPOW. If MINPOW is greater than the predetermined constant LARGEPOW, as may be determined at 805, then the returned generic type is LARGE DEFAULT TYPE, as indicated at 806. LARGEPOW is typically set to 150 Watts. If MINPOW is less than the predetermined constant SMALLPOW, as may be determined at 807, then the returned generic type is SMALL DEFAULT TYPE, as indicated at 808. SMALLPOW is typically set to 50 Watts. If MINPOW is between SMALLPOW and LARGEPOW, then the returned generic type is MEDIUM DEFAULT DEVICE, as indicated at 809.

Figure 9A:
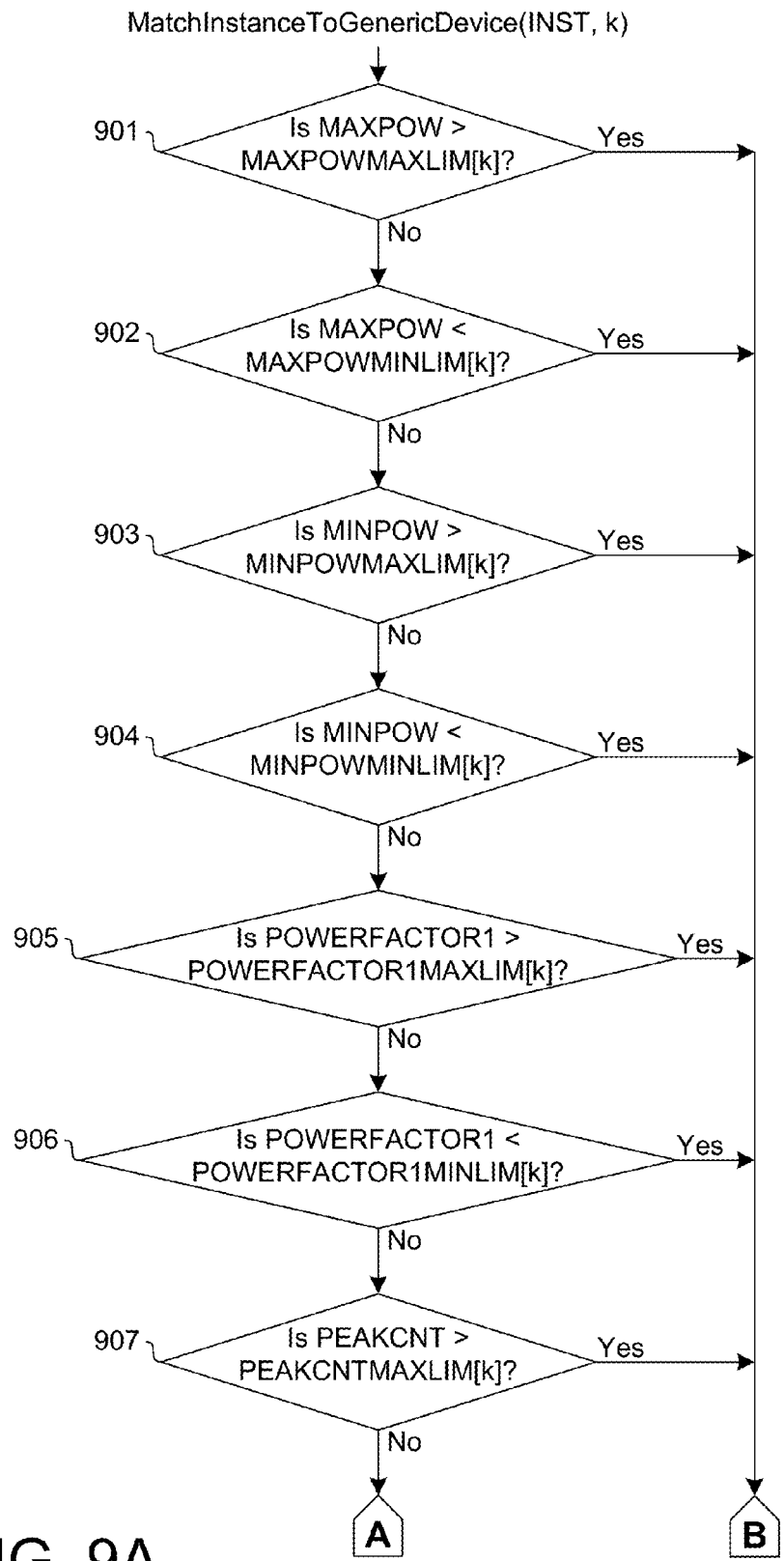
FIG. 9 is a flow diagram of a MATCH INSTANCE TO A GENERIC DEVICE[K] process in accordance with certain embodiments of the disclosed technology.

FIG. 9 is a flow diagram of a MATCH INSTANCE TO A GENERIC DEVICE[K] process in accordance with certain embodiments of the disclosed technology. More particularly, FIG. 9 is a general flow diagram of a typical specific generic device function MatchInstanceToGenericDevice(INST, k).

In the example, the first set of tests compare values of selected generic parameters 801 with predetermined constants associated with each generic device k. For the example of FIG. 9, the parameters MAXPOW, MINPOW, POWERFACTOR1, PEAKCNT and STEPCNT are tested to determine whether they are each within the range of maximum limit ( . . . MAXLIM[k]) and minimum limit ( . . . MINLIM[k]), as indicated at 901-902, 903-904, 905-906, 907-908, and 909-910, respectively. If any of the selected parameters are outside the specified range for that parameter, then the function returns FALSE.

If all selected generic parameters are in range, then the characterizing sequence of features may be tested, as indicated at 911. For most generic devices, only the features of the power time trace need be considered. For some generic devices, the features of the reactive power time trace may also be considered. For the example illustrated in FIG. 9, the characterizing sequence begins with the feature GENFEATURE[k][0]. Each feature type in FEATURES[INST][ ] may be sequentially compared with the first feature of the characterizing sequence, as indicated at 912. If the first characterizing feature is not found, then FALSE may be returned. If the first characterizing feature is found, however, then the next sequential features may each be compared to the corresponding characterizing feature, as indicated at 913. If all of the characterizing features match, then TRUE is returned. If any feature does not match, then FALSE is returned.

The selected parameters, their respective limits, and the sequence of characterizing features may be determined by inspection of time traces of various known devices such as those illustrated in FIGS. 1A and 1B. Further, it will be appreciated that the flow diagram of FIG. 9 can easily be adapted by one having ordinary skill in the art to match the observed range of behaviors of different devices of the same generic device type.

For example, the sequence of characterizing features of the power time trace of all refrigerators is {positive step or positive small peak}, maximum negative slope, minimum slope, and maximum negative slope. There should be no other features between the three slope features. While there could be other minimum, maximum, or slope features following these, the variations in the values should be small. For the refrigerator generic type, the process may be adapted to search for either a positive step or a positive small peak and a test for the fourth characterizing feature may be added.

The following may be applied for residential refrigerators:
800 Watts<MAXPOW<2500 Watts
50 Watts<MINPOW<500 Watts
0.1<POWERFACTOR1<0.7
0<=PEAKCNT<=1
0<=STEPCNT<=1

FIG. 10 is a flow diagram of a CalulateMatchError(j, k) function process to determine the match error value between two feature descriptions of time traces in accordance with certain embodiments of the disclosed technology. In the example, the parameter j is the instance number and k is the device number. Since the feature descriptions for instances and devices are identical, the function is easily adaptable to returning the match error between two instances. For the function CalulateMatchError2(j, k), discussed below, both j and k are instance numbers.

Here, the quick match parameters are first tested, as indicated at 1001. If any quick match parameter fails to match, then CalulateMatchError(j, k) may return the value DEFAULTMIN (e.g., a value larger than any possible match error such as 1,000,000), as indicated at 1002. The testing order and match criteria for each quick match parameter may be as follows:

1. Generic device type: must be equal
2. Service leg: must be equal
3. Instance code: must be equal
4. Average power during first 50 samples: must be within 50%
5. Average current during first 50 samples: must be within 50%
6. Average reactive power during first 50 samples: both must be less than 5% of average power or be within 50%

Testing the quick match parameters in this order generally uses the least processing power to return a DEFAULTMIN value for larger numbers of tests.

If the tests of the quick match parameters pass, then the match error may be calculated. The match error is generally a weighted and normalized least squares sum of the match errors between pairs of features that match. A weighted match error value may also be determined for all features that do not match with any feature in the other time trace.

If the values or samples being compared are V1 and V2, then the normalized error NERR is as follows:

$$NERR=(W*abs(V1-V2))/(abs(V1)+abs(V2)).$$

Here, W is the weight of this comparison relative to others. All NERR2 and all W for all comparisons are summed to get REER=SUM(NERR2) and RWERR=SUM(W). The final match error value returned is square root (REER)/RWERR.

The variable WEIGHT[ ] is a one dimension array with three elements. It determines the relative importance of the match error of the time traces for power, reactive power, and current. Since power is always important, WEIGHT[power]=1.

If there is very little reactive power relative to power, then the reactive time trace may be determined mostly be measurement noise, so the match error of the reactive time trace generally has little value. Therefore, WEIGHT[reactive power]=average(abs(reactive power))/average(power). WEIGHT[reactive power] is generally limited to a maximum value of 1. The averages may be determined using the sum of check-point feature values from the instance and device.

WEIGHT[current]=1−0.5*WEIGHT[reactive power]. This adjustment for large reactive power balances the match error so that each parameter time trace may be appropriately considered in determining the total match error. Other methods of determining the relative weighting may be used. The important behavior is to reduce WEIGHT[reactive power] when the instance and device have small reactive loads.

The variables REER and RWERR may be initialized to zero.

The error contribution for the features of the power, reactive power, and current time traces may be calculated and accumulated. The parameter TERR may be initialized using the match error between the 50 sample average values (e.g., quick match parameters) and WERR may be set to the weight BIN, which is typically three times the weighting of a feature match. These variables may then be used to accumulate the weighted match error (TERR) and the weighting (WERR) applied to each match error.

Sub-process 1003 may sequentially select all feature triples jj for instance j. For example, suppose FIG. 10 illustrates instance j, and the 6 feature triplets that represents its power time trace. The variable jj sequentially selects each feature in order, the order determined by increasing sample number. The variable FERR may be used to find the minimum match error (e.g., the best match) between the feature jj and a feature kk from the feature description of device k. FERR may be initialized to a large value DEFAULTMIN.

Sub-process 1004 may sequentially select each feature kk of device k. Since the instance and device feature descriptions have the same structure, FIG. 10 can also represent the device k and its feature triplets. The variable kk sequentially selects each feature in order, the order determined by increasing sample number. The variable TERR may be set to the return value of the function FeatureMatch(jj, kk) which is described in the following. This function generally uses the feature types, feature samples, and feature values to determine the match error. The default error value DEFAULTMIN may be returned if the features are too dissimilar.

In the example, the FeatureMatch(jj, kk) function first compares the feature types for an exact match or similar match. The comparison is made using predetermined values in the two dimensional (14 by 14) element array FMATCH[ ][ ]. The feature code of jj and kk may be used to access FMATCH[ ][ ]. As discussed above, the feature codes may range from 1 to 14. A value of zero in FMATCH[ ][ ] generally corresponds to no match, and DEFAULTMIN is returned.

Non-zero values in FMATCH[ ][ ] may be used as error multipliers. If the features are the same, the value is 1. If the features are related, the values are greater than 1. The match error is larger (without affecting the weighting) when the value is greater than 1.

If the features are closely related, the value is 2. For example, a small positive peak and a large positive peak are typically differentiated by a threshold. Therefore, a small difference in sample values can cause a change in feature type.

If the features are similar, then the value is 3. For example, a step and a large peak both represent a rapid change in values. If the peak is a few samples wide, then variations in sampling or device behavior can change a peak into a step.

The FeatureMatch(jj, kk) function next compares the absolute difference SDIF between feature sample numbers. If SDIF exceeds a predetermined maximum MAXSAMPDIF, then there is no match and DEFAULTMIN is returned. If the feature sample of the jj feature is SAMPNUM, then MAXSAMPDIF=5+(SAMPNUM/3). Therefore, the maximum allowed difference increases as the sample increases. If SDIF is less than or equal to MAXSAMPDIF, then the normalized error values are calculated for the differences in sample numbers and differences in sample values.

The sample number resolution is small compared to the resolution of values. Mismatch errors of up to 2 samples may be caused by sampling. The relatively small values of sample numbers may make this a large error. Therefore, the value 2 is subtracted from SDIF before its weighted match error contribution is calculated.

The normalized match errors for sample difference and value difference are added and the total scaled by 1, 2 or 3, depending on the closeness of feature type match. This value is then returned by FeatureMatch(jj, kk)

If there is a match, FERR is the smallest match error and MINKK is the index to the matching feature in device kk. If FERR is less than DEFAULTMIN, as may be determined at 1005, then the weight for the error may be determined, as indicated at 1006. Sub-process 1006 also marks the instance feature jj and device feature MINKK as used. These two features contributed to the total match error, and are therefore excluded from additional error processing.

The weight generally depends on the strength of the feature. Peaks, steps, and decay features have weights=1. Checkpoint and end of report features have weights=0.7, minimum and maximum value features have weights=0.3. Slope features have weights=0.3. (The weight value of the weakest feature may be used if the features have different weights.) The variable TWERR may set by function MatchErrorWeight (jj, MINKK) which returns the corresponding weight value. The minimum match error FERR is weighted by TWEER and added to TERR, and TWEER is added to WERR.

Determinations are made at 1007 and 1008 as to whether the features jj and MINKK are marked as used and thus not considered in other portions of the method illustrated in FIG. 10. Sub-process 1006 marked as used all features that contributed to the total match error.

All of the features that match may be processed and marked as used. A weighted match error may be calculated for each unmatched feature in instance j. The function MisErrorWeight(jj) may be used to return the weight TWEER based on the feature type.

The function MisFeatureMatch(jj) may be used to determine the difference in values at the sample number of the feature jj. The nearest feature in device k before feature jj (e.g., smaller sample number) and the nearest feature in device k after feature jj (e.g., larger sample number) may be used to determine a value for device k at the sample number of feature jj. The function returns the normalized match error FERR between these two values. The weighted match error FERR*TWEER is added to TERR and the weight TWEER is added to WERR.

The unmatched features in device k may be processed in the same manner as that of the unmatched feature in instance j.

The total weighted match error TERR for the time trace may be weighted again by the value of WEIGHT[ ] and added to REER and WEIGHT[ ] may be added to RWEER, as indicated at 1009.

The return match error value is square root(RERR)/RWEER, as indicated at 1010.

FIG. 11 is a flow diagram of a FIND BEST SEED INSTANCE of DEVICE process in accordance with certain embodiments of the disclosed technology.

Sub-process 1101 may be used to search the set of captured instances to find the instance number of each instances associated with device DEV. If the DEVNUM of instance k is equal to DEV, as may be determined at 1102, then the index NUM may be incremented, as indicated at 1103. The instance number k may be stored in element NUM of the array INSTN[ ]. When process 1101 completes, the instance number of all the instances associated with device DEV may be stored in INSTN[ ]. The number of instances=NUM.

The CalculateMatchError2(INSTN[j], INSTN[k]) function may be used to determine the match error between instance INSTN[ ] and INSTN[k]. The function CalculateMatchError2( ) generally compares the time traces of two instances and is adapted from the function CalculateMatchError( ), which compares an instance and a device. The two dimensional array MERR[ ][ ] may contain the match error value between every combination of pairs of instances associated with device DEV, as indicated at 1104.

The RMS total error of instance INSTN[j] may be calculated and matched to every other instance. The variable TERR may be used to accumulate the squares of the match errors stored in MERR[ ][ ], as indicated at 1106.

After sub-process 1105 completes for instance INSTN[j], the RMS error TERR may be calculated and compared to MINERR, as indicated at 1107 and 1108, respectively. If the error TERR is less than MINERR, then MINERR=TERR and NEWSEED may be set to INSTN[j], as indicated at 1109.

NEWSEED generally refers to the instance number of the instance that has the smallest total RMS match error to all of the other instances associated with device DEV. Therefore, this is usually the new best seed instance for the device. The specification instance for device DEV may then be changed to be NEWSEED and all affected variables may be updated, as indicated at 1110.

FIG. 12 is a flow diagram of a CLUSTER ANALYSIS for DEVICE process in accordance with certain embodiments of the disclosed technology. The process may be run only when there are 100 or 500 instances associated with a device, for example. This may ensure that there are sufficient instances to establish reliable statistical behavior.

In the example, the process first fills the array INSTN[ ] with the instance numbers associated with device DEV, as indicated at 1201. The two-dimensional array MERR[ ][ ] may then be filled with the match error of every pair combination of the instances associated with device DEV, as indicated at 1202.

A two dimensional array ID[ ][ ] may be initialized with index values to INSTN[ ] that were used to generate the match error values stored in MERR[ ][ ], as indicated at 1203. This array may be used to track the identity the instance as values are moved in MERR[ ][ ].

NUM match error values may be sorted in row j of MERR [j][ ]. The values are generally sorted so that the smallest value is at index k=1, as indicated at 1204. There will be at least one match error value of zero since each row contains a self match of instance j to instance j. As values are moved in j row of MERR[j][ ], the same moves are replicated in array ID[j][ ], as indicated at 1204. After the row is sorted, the values in the row j of ID[j][ ] are the indexes into INSTN[ ] that contains the instance number corresponding to the sorted match error.

MERR[ ][ ] generally contains the sorted match error values for all of the instances and ID[ ][ ] links the match errors to the pair of instance that produced the match error. Ideally, the distribution of match errors should be Gaussian if the instance were produced by a single device. Therefore, the sorted error values should slowly and uniformly increase. Likewise, the difference between successive values should also uniformly increase.

If the instances were produced by two of more distinctive devices, then there should be a separate Gaussian distribution of match errors for each device. The match error between any pair of instances produced by different devices should be greater than any match error between instances produced by the same device.

If there are instances produced by different devices, the sorted error values will have a step increase between adjacent values followed by a reduction in rate of change. Each different device will cause a separate step change followed by a reduced rate of change.

Each sorted row should have the same number of steps, but these will typically occur at different locations in the sort. For example, suppose there are instances produced by three distinct devices A, B, and C. Suppose device A produced 100 instances, device B produced 150 instances, and device C produced 250 instances. The sorted match errors for instances produced by Device A will have its first step between k=100 and k=101. There will be 100 rows with a step between these indexes. The sorted match errors for instances produced by Device B will have its first step between k=150 and k=151. There will be 150 rows with a step between these indexes. The sorted match errors for instances produced by Device C will have its first step between k=250 and k=251. There will be 250 rows with a step between these indexes.

For device A instances, the second step could occur between samples 250 and 251 or between samples 350 and 351. For device B instances, the second step could occur between samples 250 and 251 or between samples 350 and 351. For device C instances, the second step could occur between samples 350 and 351 or between samples 400 and 401. This example assumes ideal conditions and measurements. Typically, a small percentage of instances will produce anomalous results. Therefore the process is adapted for reasonable variations form ideal behavior.

An initial value of threshold DMIN may be determined at 1205 to detect step changes in the sorted match errors. The average value of the $5^{th}$ (for 100 instances) or $25^{th}$ (for 500 instances) smallest match errors may be found in each sorted row (e.g., Num/20=5 or 25 for 100 or 500 instances). The match error values from NUM sorted rows may be accumulated in DMIN and then DMIN may be divided by NUM to get the average, as indicated at 1206.

The variable DIFAVE may be used to calculate the average number of steps in each row and may be initialized to zero, as indicated at 1206.

The process may search for step changes in the row values and record detected changes in the two dimensional array STEP[ ][ ], as indicated at 1207. The variable DIFAVE may be used to adjust the value of DIF if necessary. Each j row of sorted values may be processed.

The array STEPCNT[ ] may be used to count the detected step changes in the match errors in each row j and may be initialized to zero.

In certain embodiments, the process only considers the smallest 95% of the match error values. This prevents likely anomalous instances with the largest match errors from affecting the process. DIF is set to the difference in match error values between adjacent values k and k+1. If DIF is less than or equal to DMIN, as may be determined at 1208, then there is no step and STEP[j][k] is set to zero, as indicated at 1209. If DIF is greater than DMIN, however, then there is a step. The value of the step may thus be saved in STEP[j][k] and STEPCNT[j] may be incremented to count the steps in the row, as indicated at 1210.

After sub-process 1207 completes, the number of detected steps may be added to DIFAVE, as indicated at 1211.

DIFAVE may be divided by NUM to get the average number of detected steps in each row, as indicated at 1212. If DIFAVE is greater then or equal to 4, as may be determined at 1213, then too many steps were detected to proceed. The step detection threshold DMIN may be increased by 20%, as indicated at 1214, and sub-processes 1206 and 1207 may be repeated. DMIN may continue to be increased until DIFAVE is less than 4.

If DIFAVE is less than 4, as may be determined at 1213, it is then tested to be greater than 0.9. If the average number of steps is less than 0.8, as may be determined at 1215, then there are no detectable clusters and the process ends, as indicated at 1216.

If DIFAVE is greater than or equal to 0.8, as may be determined at 1215, then there may be detectable clusters and the process may continue. The array HIST[ ], initialized to zero at 1217, may be used to count the number of detected steps at each possible location in each row j. The size of the array is NUM and all elements may be initialized to zero.

Sub-process 1218 may process each row of sorted match errors. In the example, S1 is the last index in the row where a step occurred and may be initialized to zero.

Sub-process 1218 may test each match error in row j. If there is a detected step, the number of match errors since the last step IND may be calculated. It is the difference between the current index k and the index of the last step. IND may be used to index HIST[ ] and that element may be incremented. S1 may then be set to current index k.

After sub-process 1218 completes, the values in HIST[ ] typically represent the distribution of number of error values between detected steps. Sub-process 1220 may be used to determine whether this distribution is representative of clusters.

The array SNUM[ ] may be used to store the number of match errors between detected steps. This is equivalent to the number of instances in a cluster since each error value corresponds to an instance that is very similar to the other instances between detected steps. Since no more than 5 clusters are considered, there are 5 elements in SNUM[ ] that are all initialized to zero. The variable k may be used to index SNUM[ ] and count the number of clusters.

Each element of HIST[j] may be checked at 1221 to determine whether there is a cluster that contains j elements. If HIST[j] is greater than 90% of the total number of instances, then there are clusters, the index k may be incremented, and SNUM[k] may be set to j, the number of instances in the cluster, as indicated at 1222.

After sub-process 1220 completes, the value of k may be tested, as indicated at 1223. If k=0, there are no clusters and the CLUSTER ANALYSIS process is complete, as indicated at 1224.

There are at least two clusters if k is greater than zero. It is possible that two (or more) clusters have exactly the same number of instances. In this case, the value of one element in HIST[ ] will be greater than NUM. The variable NC may be used to determine the number of clusters. NC may be first set to one plus the number of non-zero elements of SNUM[ ], as indicated at 1225.

Sub-process 1226 may then use each non-zero element j of SNUM[ ] to index to the value of HIST[SNUM[j]]. If this value is significantly greater than NUM, then many rows in STEP[ ][ ] have the same number of match errors between two or more detected steps. This means that two or more clusters have exactly the same number of instances. If HIST[SNUM[j]] is greater then 1.8*NUM, as indicated at 1227, then NC may be increased by the fix value (e.g., truncated to an integer) of HIST[SNUM[j]]/(0.9*NUM), as indicated at 1228. After sub-process 1226 completes, NC is equal to the number of clusters and, therefore, the number of devices represented by the group of instances. NC−1 new devices may then be created, as indicated at 1229.

Sub-process 1230 may be used to qualify instances with the new set of devices. An instance is generally considered qualified if all the spacing between its detected steps in STEP[ ][ ] match the spacing specified in SNUM[ ]. The order of the spacings will be different for instances that are associated with different devices. All instances that have the same spacings are associated with the same device.

The first qualified instance QINST may be used to determine the initial association. The instances that have the smallest match (e.g., those before the first detected step) may be associated with the first device. Instances between the first detected step and the second detected step (or the remaining instances up to the (Num—NUM/20) instance) may be associated with the second device. The remaining 5% of instances are not initially associated with any device. If there are additional detected steps, the instances between the steps are associated with the next sequential device.

After the initial association of instances to devices using the sorted match errors of the first qualified instance, each other qualified instance is checked to verify it produces the same associations for all instances. If there is a discrepancy in any association, the instance is disassociated from the device. After the association process, a well qualified group of instances are associated with each of the NC devices.

The association process may use the runtimes and energy associated with each instance to determine the total runtime, total energy, and average power represented by the NC devices.

A FIND BEST SEED INSTANCE process may be performed for each NC device to find the best seed device.

The value of DEVMIN may adjust for each NC device. This is typically determined using the sorted match errors for the seed instance of the device. DEVMIN is set to average of the match error just before the first detected step and the match error just after the step.

After sub-process 1230 completes, most of the instances are now associated with one of the NC devices. Sub-process 1231 then process the unassociated instances. The match error between each unassociated instances and each device may be determined, as indicated at 1232. If a match is found, then the instance may be assigned to the matching device, as indicated at 1233. If no match is found, a new device may be created using the unassociated instance as the seed instance, as indicated at 1234.

Figure 13:
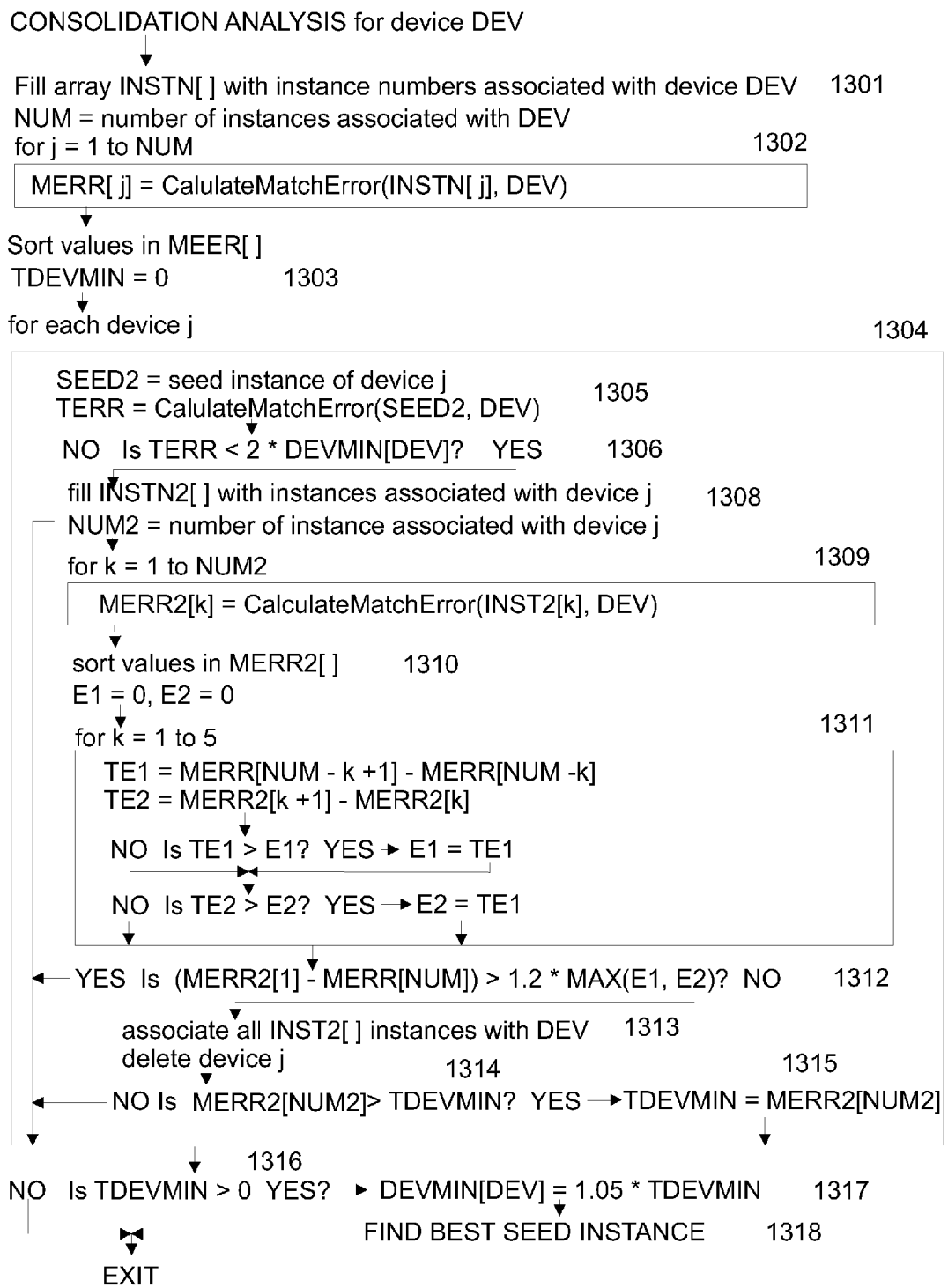
FIG. 13 is a flow diagram of a CONSOLIDATION ANALYSIS process in accordance with certain embodiments of the disclosed technology.

FIG. 13 is a flow diagram of a CONSOLIDATION ANALYSIS process in accordance with certain embodiments of the disclosed technology. This process may be used to increase the value of DEVMIN[ ] to make matching instances to a device less selective. This is often beneficial for devices that naturally produce highly variable time traces. When DEVMIN[ ] is too selective, for example, the match error between a new instance created by the device and its seed instance frequently exceeds the device's match threshold DEVMIN[ ]. A new device may be created using the unmatched instance as the seed instance. Several new devices may be needed to represent the full variability of instances produced by the device. The CONSOLIDATION ANALYSIS process searches for similar devices and, if found, consolidates the devices to a single device and increases the value of its DEVMIN[ ].

The first step of the CONSOLIDATION ANALYSIS process is to fill array INSTN[ ] with the NUM instance numbers associated with device DEV, as indicated at 1301.

The array MERR[ ] may be filled with the match error values between each instance associated with device DEV and the device DEV, as indicated by 1302. These values may then be sorted from smallest to largest.

The variable TDEVMIN may be used to determine the new value of DEVMIN[DEV] and is initialized to zero at 1303.

Sub-process 1304 may process each device j to determine whether it should be consolidated with device DEV. The first step of the process in the example includes setting the variable SEED2 to the seed instance number of the device j, as indicated at 1305. Then TERR is set to the match error values between the seed instances of device j and device DEV, as indicated at 1305. TERR may then be compared to twice the value of DEVMIN[DEV], as indicated at 1306. If the match error is more than 2*DEVMIN[DEV], then device j is not a candidate for consolidation.

If TERR is less than 2*DEVMIN[DEV] then device j is a candidate for consolidations. The array INSTN2[ ] may be filled with the instance numbers associated with device j, as indicated at 1308. In the example, NUM2 is the number of devices associated with device j.

The array MERR2[ ] may be filled with the match error values between each instance associated with dev j and device DEV, as indicated at 1309. The match error values in MERR2[ ] may then be sorted, as indicated at 1310.

In the example, sub-process 1311 may be used to find the largest change in sequential error values for five differences at the end of MERR[ ] and for five differences at the beginning of MERR2[ ]. After sub-process 1311 completes, variable E1 is the largest difference between the MERR[ ] samples and E2 is the largest difference between the MERR2[ ] samples.

If the instances in INSTN[ ] and INSTN2[ ] were produced by the same device, the difference between the last error value in MEER[ ] and the first error value in MEER2[ ] should be about the same as the nearby differences, and not much larger than the largest differences. The difference MERR2[[1]–MERR[NUM] is compared to 1.2 of the maximum of E1 and E2, as indicated at 1312. If the difference is larger, then there is a significant step in error values and the instances in INSTN[ ] were likely produced by a different device than the instances in INSTN2[ ].

If the difference is less, then the instances were probably produced by the same device and the creation of the separate devices DEV and j is an artifact of DEVMIN[DEV] set to value that is too small. Therefore, device j should be consolidated into DEV. Accordingly, all of the instances in INSTN2[ ] may be associated with device DEV and device j may be deleted, as indicated at 1313.

In the example, the value of MERR2[NUM2] is the largest match error value between DEV and all instances associated with device j.

If MERR2[NUM2] is greater than TDEVMIN, as may be determined at 1314, then TDEVMIN may be set to the value of MERR2[NUM2], as indicated at 1315.

At least one device was consolidated if TDEVMIN is greater than zero, a determination that may be made at 1316. If there was consolidation, then DEVMIN[DEV] may be set to 105% of the TDEVMIN, as indicated at 1317. Then, a FIND BEST SEED INSTANCE process may process the larger group of instances now associated with DEV to find the best seed instance, as indicated at 1318.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated. In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:

1. A method for identifying an electrical device coupled to a power supply, comprising:
    detecting a positive transition in a time trace disaggregation process (TTDP);
    creating a new instance j;
    capturing a positive transition data block for the instance j;
    creating a time trace feature description for at least one of the following: power, reactive power, and current;
    matching the instance j to a device type by performing a quick match based on at least one of a plurality of quick match parameters;
    responsive to a positive identification based on the quick match, performing a match based on said feature description; and
    responsive to positive identification, assigning the instance j to the device type.

2. The method of claim 1, wherein the positive transition data block comprises samples for at least one of the following: power, reactive power, and current.

3. The method of claim 1, further comprising determining values of at least one of power, reactive power, and current for samples immediately before the positive transition.

4. The method of claim 1, wherein the matching further comprises:
    performing a CalculateMatchError(j,k) function to determine an error value TERR that is a measure of similarity between the instance j and a device k; and
    based on a result of the CalculateMatchError(j,k) function, creating a new device using the instance j or assigning the instance j to the device k.

5. The method of claim 4, wherein performing the CalculateMatchError(j,k) function comprises determining whether the value of TERR is less than a threshold match error value DEVNIM[j] for the device k.

6. The method of claim 5, further comprising normalizing TERR by dividing TERR by DEVMIN[k] and then comparing the result to ERRMIN.

7. The method of claim 1, wherein the plurality of quick match parameters comprises at least one of the following: average power during a predefined number of samples, average reactive power during a predefined number of samples, and average current during a predefined number of samples.

8. The method of claim 7, wherein the plurality of quick match parameters further comprises at least one of the following: generic device type, service leg, and instance code.

9. The method of claim 1, wherein the matching further comprises performing a MatchInstanceToGenericDevice (j,k) function, the MatchInstanceToGenericDevice (j,k) comprising testing a MAXPOW parameter to determine whether the MAXPOW parameter is within a range of a MAXPOW maximum limit and a MAXPOW minimum limit.

10. The method of claim 9, wherein performing the MatchInstanceToGenericDevice (j,k) function further comprises testing a MINPOW parameter to determine whether the MINPOW parameter is within a range of a MINPOW maximum limit and a MINPOW minimum limit.

11. The method of claim 10, wherein performing the MatchInstanceToGenericDevice (j,k) function further comprises testing a POWERFACTOR1 parameter to determine whether the POWERFACTOR1 parameter is within a range of a POWERFACTOR1 maximum limit and a POWERFACTOR1 minimum limit.

12. The method of claim 11, wherein performing the MatchInstanceToGenericDevice (j,k) function further comprises testing a PEAKCNT parameter to determine whether the PEAKCNT parameter is within a range of a PEAKCNT maximum limit and a PEAKCNT minimum limit.

13. The method of claim 12, wherein performing the MatchInstanceToGenericDevice (j,k) function further comprises testing a STEPCNT parameter to determine whether the STEPCNT parameter is within a range of a STEPCNT maximum limit and a STEPCNT minimum limit.

14. The method of claim 1, wherein the matching further comprises performing a CalulateMatchError(j, k) function, the CalulateMatchError(j, k) function comprising:
    sequentially selecting all feature triples jj of the feature description of instance j; and determining whether each of the feature triples jj are marked as used.

15. The method of claim 14, wherein performing the CaluateMatchError(j, k) function further comprises:
   sequentially selecting all feature triples kk of the feature description of device k; and
   determining whether each of the features kk are marked as used.

16. The method of claim 15, further comprising using a FeatureMatch(jj, kk) function to compare the feature triples jj of instance j to the feature triples kk of device k.

17. The method of claim 16, further comprising using a MisFeatureMatch(jj) function to compute the error contribution of each unused feature triple jj of instance j.

18. The method of claim 1, further comprising performing a CLUSTER ANALYSIS process to determine whether a device match threshold DEVMIN[ ] is too large such that two or more different devices are combined into a single device.

19. The method of claim 18, further comprising:
   creating new devices so that there is a separate device for each cluster of instances found by the CLUSTER ANALYSIS process; and
   selecting a value for the device match threshold DEVMIN[ ] for each separate device to provide sufficient selectivity so that new instances are properly matched to one of the separate devices.

20. The method of claim 1, further comprising performing a CONSOLIDATION ANALYSIS process to determine if there are multiple devices that can be consolidated.

21. The method of claim 20, further comprising:
   associating the instances of multiple devices with a single device based on a result of the CONSOLIDATION ANALYSIS process; and
   adjusting the single device match threshold DEVMIN[ ] to ensure that new instances are correctly matched to the single device.

* * * * *